US007579262B2

(12) United States Patent
Hoentschel et al.

(10) Patent No.: US 7,579,262 B2
(45) Date of Patent: Aug. 25, 2009

(54) DIFFERENT EMBEDDED STRAIN LAYERS IN PMOS AND NMOS TRANSISTORS AND A METHOD OF FORMING THE SAME

(75) Inventors: Jan Hoentschel, Dresden (DE); Andy Wei, Dresden (DE); Manfred Horstmann, Duemroehrsdorf-Dittersbach (DE); Thorsten Kammler, Ottendorf-Okrilla (DE)

(73) Assignee: Advanced Micro Devices, Inc., Austin, TX (US)

( * ) Notice: Subject to any disclaimer, the term of this patent is extended or adjusted under 35 U.S.C. 154(b) by 507 days.

(21) Appl. No.: 11/562,001

(22) Filed: Nov. 21, 2006

(65) Prior Publication Data
US 2008/0090349 A1   Apr. 17, 2008

(30) Foreign Application Priority Data
Mar. 31, 2006   (DE) ................ 10 2006 015 090

(51) Int. Cl.
*H01L 21/20* (2006.01)
*H01L 21/76* (2006.01)
*H01L 21/336* (2006.01)

(52) U.S. Cl. .............. 438/478; 438/269; 438/413; 257/E21.601; 257/E21.403; 257/E21.632

(58) Field of Classification Search ............ 438/222, 438/226, 241, 269, 363, 384, 388, 413, 416; 257/E21.601, E21.403, E21.632
See application file for complete search history.

(56) References Cited

U.S. PATENT DOCUMENTS

| 5,864,161 | A |  | 1/1999 | Mitani et al. ............ 257/347 |
| 6,165,826 | A |  | 12/2000 | Chau et al. ................ 438/231 |
| 6,891,192 | B2 | * | 5/2005 | Chen et al. .................. 257/49 |
| 7,067,368 | B1 | * | 6/2006 | Fang et al. ................ 438/199 |
| 7,112,481 | B2 | * | 9/2006 | Fang et al. ................ 438/199 |
| 7,178,110 | B2 | * | 2/2007 | Fujino ...................... 715/838 |
| 7,326,601 | B2 | * | 2/2008 | Wirbeleit et al. .......... 438/151 |
| 7,348,232 | B2 | * | 3/2008 | Chidambaram et al. .... 438/199 |

FOREIGN PATENT DOCUMENTS

| DE | 103 51 008 A1 | 6/2005 | ............ 21/336 |
| JP | 2004031753 A | 1/2004 | ............ 29/78 |

* cited by examiner

*Primary Examiner*—Alexander G Ghyka
*Assistant Examiner*—Seahvosh J Nikmanesh
(74) *Attorney, Agent, or Firm*—Williams, Morgan & Amerson, P.C.

(57) ABSTRACT

By omitting a growth mask or by omitting lithographical patterning processes for forming growth masks, a significant reduction in process complexity may be obtained for the formation of different strained semiconductor materials in different transistor types. Moreover, the formation of individually positioned semiconductor materials in different transistors may be accomplished on the basis of a differential disposable spacer approach, thereby combining high efficiency with low process complexity even for highly advanced SOI transistor devices.

23 Claims, 13 Drawing Sheets

DIFFERENT EMBEDDED STRAIN LAYERS IN PMOS AND NMOS TRANSISTORS AND A METHOD OF FORMING THE SAME

BACKGROUND OF THE INVENTION

1. Field of the Invention

Generally, the present invention relates to the formation of integrated circuits, and, more particularly, to the formation of different transistor types, such as SOI-like transistors in the form of fully and partially depleted transistors, formed in and on a thin semiconductor layer and having strained channel regions by using an embedded strain layer to enhance charge carrier mobility in the channel region.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source regions.

The conductivity of the channel region, i.e., the drive current capability of the conductive channel, is controlled by a gate electrode formed near to the channel region and separated therefrom by a thin insulating layer. The conductivity of the channel region, upon formation of a conductive channel, due to the application of an appropriate control voltage to the gate electrode, depends on the dopant concentration, the mobility of the majority charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the overall conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The continuing shrinkage of the transistor dimensions, however, involves a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation. Moreover, highly sophisticated dopant profiles, in the vertical direction as well as in the lateral direction, are required in the drain and source regions to provide low sheet and contact resistivity in combination with a desired channel controllability.

The continuous size reduction of the critical dimensions, i.e., the gate length of the transistors, necessitates the adaptation and possibly the new development of highly complex process techniques concerning the above-identified process steps. It has been proposed to enhance the channel conductivity of the transistor elements by increasing the charge carrier mobility in the channel region for a given channel length, thereby offering the potential for achieving a performance improvement that is comparable with the advance to a future technology node while avoiding or at least postponing many of the above process adaptations associated with device scaling. One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, creating tensile strain in the channel region may increase the mobility of electrons, which, in turn, may directly translate into a corresponding increase in the conductivity. On the other hand, compressive strain in the channel region may increase the mobility of holes, thereby providing the potential for enhancing the performance of P-type transistors. The introduction of stress or strain engineering into integrated circuit fabrication is an extremely promising approach for further device generations, since, for example, strained silicon may be considered as a "new" type of semiconductor material, which may enable the fabrication of fast and powerful semiconductor devices without requiring expensive semiconductor materials, while many of the well-established manufacturing techniques may still be used.

Thus, in some approaches, external stress created by, for instance, overlaying layers, spacer elements and the like is used in an attempt to create a desired strain within the channel region. However, the process of creating the strain in the channel region by applying a specified external stress may suffer from an inefficient translation of the external stress into strain in the channel region.

In another approach, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source regions of the PMOS transistors are selectively recessed, while the NMOS transistors are masked and subsequently the silicon/germanium layer is selectively formed in the PMOS transistor by epitaxial growth. Thus, complex manufacturing steps, such as etch processes, the formation of appropriate etch and growth masks and selective epitaxial growth techniques have to be incorporated into the CMOS process flow. Moreover, for SOI transistors formed in very thin silicon layers having a thickness of approximately 100 nm and even less, this technique may not result in the expected performance gain as is the case in SOI devices including less scaled active silicon layers or in bulk devices, since the stress transfer is substantially restricted to the channel region located below the gate insulation layer while lower-lying active regions in the thin SOI transistor may not be effectively strained, thereby reducing the overall efficiency of the strain engineering process. In addition, the performance gain for transistors of different conductivity type may lead to an even more complex process flow, as the various steps for the formation of respective strain layers may have to be performed separately for each transistor type.

In view of the above-described situation, there exists a need for an improved technique that enables an increase of performance of PMOS transistors and NMOS transistors on the basis of strained layers in an efficient manner.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of differently strained semiconductor layers in different transistor types, such as P-channel transistors and N-channel transistors, on the basis of a highly efficient manufacturing process flow since, in one aspect, the provision of a hard mask, typically provided for selectively epitaxially growing strained semiconductor layers, may be omitted for at least one type of transistor, thereby significantly reducing process complexity, while at the same time an additionally grown strained semiconductor material may be advantageously used in further process steps, such as silicidation. In other aspects, one or more hard masks required for the selective epitaxial growth technique may be formed in a highly efficient manner, for instance without requiring a lithography step, thereby also providing a highly efficient technique for the formation of strained semiconductor layers of different characteristics in various transistor types. In yet another aspect of the present invention, a strained layer may be provided for different types of transistors in that a disposable spacer approach may be used, in which appropriate offset spacer elements for each type of transistor may be individually formed, thereby enabling the positioning of strained semiconductor material close to a channel region, which may be highly advantageous in the context of SOI transistor elements with moderately thin active semiconductor layers for the formation of partially and fully depleted transistor devices.

According to one illustrative embodiment of the present invention, a method comprises forming a first recess adjacent to a first gate electrode of a first transistor, wherein the first gate electrode is formed above a substrate comprising a crystalline semiconductor layer. Furthermore, a second recess is formed adjacent to a second gate electrode of a second transistor. Moreover, a first strained semiconductor material is epitaxially grown in the first recess and a second strained semiconductor material is epitaxially grown in the second recess and above the first strained semiconductor material.

According to another illustrative embodiment of the present invention, a method comprises forming a first recess adjacent to a first gate electrode of a first transistor, wherein the first gate electrode is formed above a substrate comprising a crystalline semiconductor layer. A second recess is formed adjacent to a second gate electrode of a second transistor. Additionally, a first strained semiconductor material is formed in the first recess and a second strained semiconductor material is formed in the second recess on the basis of a first and a second epitaxial growth process based on one or more growth masks formed without a lithographical patterning process.

According to yet another illustrative embodiment of the present invention, a method comprises forming a first recess adjacent to a first gate electrode of a first transistor, wherein the first gate electrode has a first sidewall spacer and is formed above a substrate comprising a crystalline semiconductor layer. Furthermore, a first strained semiconductor material is formed in the first recess, while a second transistor is covered. The method further comprises forming a second recess adjacent to a second gate electrode of the second transistor, wherein the second gate electrode has a second sidewall spacer. Furthermore, a second strained semiconductor material is formed in the second recess and the first sidewall spacer is removed. Finally, the second sidewall spacer is removed.

BRIEF DESCRIPTION OF THE DRAWINGS

The invention may be understood by reference to the following description taken in conjunction with the accompanying drawings, in which like reference numerals identify like elements, and in which.

Figure 1A:
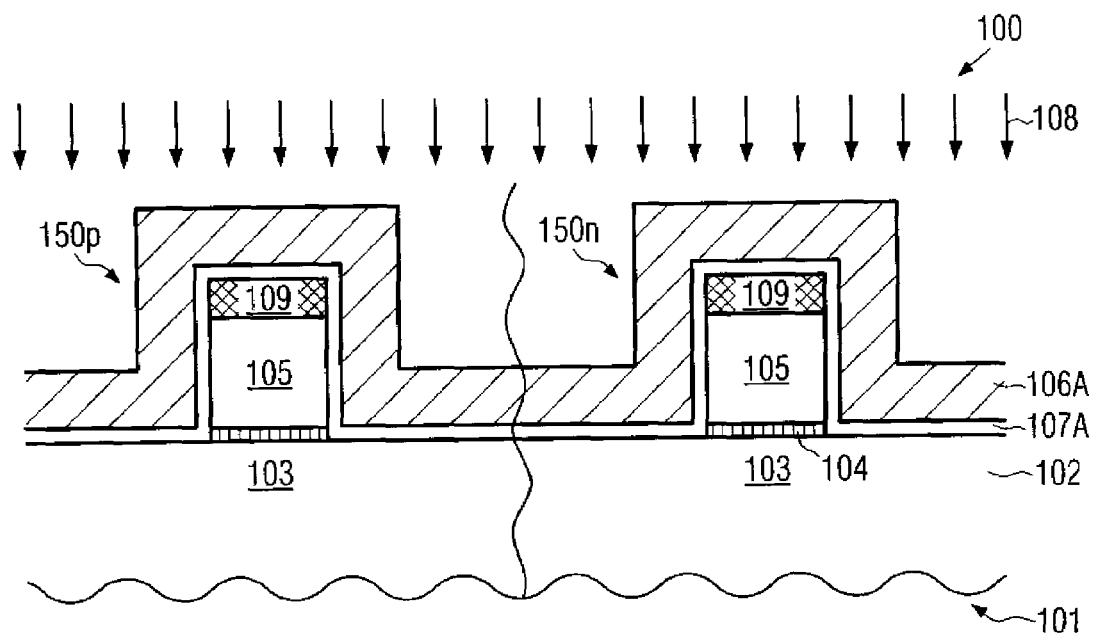
FIGS. 1a-1f schematically show cross-sectional views of a semiconductor device including different transistor elements during various manufacturing stages, in which a strained semiconductor material of different characteristics is formed in drain and source regions of the different transistor elements, while one of the strained semiconductor materials acts as a cap layer for the other type of strained semiconductor material in accordance with illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i. e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention relates to the formation of field effect transistors of different types, such as different conductivity types, which receive a strained semiconductor layer in the drain and/or source regions in order to provide a desired magnitude and/or type of strain in the respective channel regions of these transistors. For this purpose, an appropriate masking scheme is provided that enables the formation of respective strained semiconductor materials on the basis of epitaxial growth techniques such that, for each transistor type, a specified magnitude and/or type of strain may be created in the semiconductor material, which may be incorporated into the respective drain and/or source regions, thereby providing an embedded strained semiconductor material. In some illustrative embodiments, the transistor types may represent N-channel transistors and P-channel transistors, wherein each type of transistor may receive a strained semiconductor material to enhance the mobility of the respective majority charge carriers in the corresponding channel regions. Since the strained semiconductor material may be provided by epitaxial growth techniques, and in particular embodiments by selective epitaxial growth techniques, highly efficient masking schemes are provided by the present invention in order to maintain process complexity at a low level while nevertheless achieving a significant enhancement in device performance due to the provision of individually adjusted strained semiconductor materials in different transistor types.

In some illustrative embodiments, a highly efficient technique for the formation of silicon-on-insulator (SOI) transistors is provided, wherein the various characteristics of the respective strained semiconductor material may be individually adapted for each transistor type, for instance in terms of offset to the respective channel region, magnitude of strain, type of strain and the like. Consequently, even for highly advanced SOI-like transistors which may be manufactured on the basis of thin semiconductor layers, thereby forming partially or even fully depleted devices, a highly efficient strain-inducing mechanism may be established, although the embedded strained semiconductor material may be provided as a shallow portion in the drain and source regions due to the required crystalline template of the original semiconductor material of the thin semiconductor layer during the epitaxial growth process. In other illustrative embodiments, highly efficient masking schemes for the provision of respective epitaxial growth masks, such as the omission of a growth mask and/or the omission of advanced lithography steps for the formation of respective growth masks, may significantly contribute to a reduced process complexity.

With reference to the accompanying figures, further illustrative embodiments of the present invention will now be described in more detail. FIG. 1a schematically illustrates a cross-sectional view of a semiconductor device 100 comprising a substrate 101, above which is formed a semiconductor layer 102. The substrate 101 may represent any appropriate carrier material for receiving the semiconductor layer 102, such as a bulk semiconductor substrate, an insulating carrier material, such as an SOI substrate, and the like. It should be appreciated that the vast majority of complex integrated circuits currently are, and will be in the foreseeable future, fabricated on the basis of silicon and thus, in some illustrative embodiments, the semiconductor layer 102 may be comprised of silicon, for instance including a significant amount of other materials, such as germanium, carbon and the like, wherein the substrate 101 may represent a bulk silicon substrate or any other appropriate carrier material. Moreover, in some embodiments, the semiconductor layer 102 may be appropriately configured to enable the fabrication of fully or partially depleted SOI transistors, as will be explained in more detail with reference to FIGS. 2a-2i. The semiconductor device 100 may further comprise a first transistor element 150p and a second transistor element 150n, which may be provided above the substrate 101 at specified substrate positions according to device requirements. In some illustrative embodiments, the first and second transistors 150p, 150n may at least differ in their respective conductivity type, whereas, in other illustrative embodiments, the first and second transistors 150p, 150n may differ in their function within a complex circuitry. For example, in the former case, the first transistor 150p may represent a P-channel transistor, while the second transistor 150n may represent an N-channel transistor, which are to receive a respective strained semiconductor material having a compressive and a tensile strain, respectively. In the latter case, in some illustrative embodiments, one of the first and second transistors 150p, 150n may represent an advanced transistor of high switching speed, while the other one of the transistors 150p, 150n may represent a transistor requiring a reduced leakage current behavior, such as a transistor in a static RAM area and the like. In addition to their different function, in this case, the transistors 150p, 150n may or may not differ in their conductivity type, wherein, however, at least a different magnitude of strain may be desired for the two types of transistors. During the following description, it may be assumed that the first and second transistors 150p, 150n differ in their conductivity type and are to receive a strained semiconductor material having a different type of strain.

In the manufacturing stage shown in FIG. 1a, the transistors 150p, 150n may each comprise a gate electrode 105, which may be formed above a respective channel region 103 and separated therefrom by a corresponding gate insulation layer 104. Moreover, in one illustrative embodiment, a spacer layer 106A may be commonly formed above the respective gate electrodes 105, wherein a liner 107A may be provided to act as an etch stop layer during an etch process 108. The spacer layer 106A may be comprised of any appropriate material, such as silicon nitride, silicon dioxide and the like, while the liner 107A may be provided in the form of any appropriate material having the required etch selectivity to the material of the layer 106A. For example, silicon dioxide may be used for the liner 107A when the spacer layer 106A is comprised of silicon nitride. Furthermore, respective capping layers 109, which may be formed of any appropriate material, such as silicon nitride and the like, may be formed on top of the respective gate electrodes 105, thereby providing an encapsulation of the gate electrodes 105 after the completion of the etch process 108 for forming respective sidewall spacers, as will be described below.

A typical process flow for forming the semiconductor device 100 as shown in FIG. 1a may comprise the following processes. After the provision of the substrate 101 and the semiconductor layer 102, for instance on the basis of epitaxial growth techniques, wafer bond techniques and the like, depending on the type of substrate and semiconductor material used, any required processes, such as implantation processes for forming vertical dopant profiles, if required, within the layer 102, and manufacturing processes for forming isolation structures (not shown), such as shallow trench isolations, may be performed on the basis of well-established techniques. Thereafter, a dielectric layer may be formed by oxidation and/or deposition with a thickness as required for the gate insulation layers 104. Next, an appropriate material for the gate electrodes 105 may be deposited, for instance in the form of polysilicon on the basis of low pressure chemical vapor deposition (CVD) techniques. It should be appreciated that in some process strategies the gate electrodes 105 in this manufacturing stage may not be represented by a highly conductive material as required, but may be converted into a respective conductive material in a later manufacturing stage. For example, a highly conductive metal silicide may be provided in the gate electrode 105 in a later manufacturing stage, when initially a polysilicon material may be provided for the gate electrodes 105. In other cases, the gate electrodes 105 may be substantially completely replaced by other materials, such as metals and the like, in a later manufacturing stage. After the deposition of the material of the gate electrodes 105, an appropriate capping material, such as silicon nitride and the like, may also be deposited on the gate electrode material, possibly in combination with other material layers, such as anti-reflective coating (ARC) materials and the like, as may be required for the subsequent lithographical patterning of the corresponding layer stack. Consequently, appropriate lithography and etch techniques may be used in order to pattern the resulting layer stack, thereby forming the gate electrode 105 on the gate insulation layer 104 and covered by the capping layers 109.

Thereafter, the liner 107A may be formed, for instance by deposition and/or by oxidation, depending on the device requirements and the material used, followed by a respective deposition process for providing the spacer layer 106A, wherein well-established plasma enhanced deposition techniques may be used. A thickness of the spacer layer 106A in combination with a thickness of the layer 107A may substantially determine a spacer width formed from the layers 106A, 107A during the etch process 108, which in turn may substantially determine a resulting offset from the gate electrode 105 for a recess to be formed in the semiconductor layer 102 adjacent to respective channel regions 103. It should be appreciated that, in some illustrative embodiments, the spacer layer 106A may be formed in accordance with process parameters selected such that corresponding spacer elements may also be used for the formation of drain and source regions by ion implantation during a later manufacturing stage, while, in other illustrative embodiments, the spacer layer 106A and the layer 107A may be formed with a thickness that is selected merely with respect to a desired offset for recesses to be formed in the layer 112 later on.

After the deposition of the layers 107A, 106A, the etch process 108 is performed on the basis of an appropriate etch chemistry to obtain a substantially anisotropic behavior with a high etch selectivity between the layers 106A, 107A. Respective selective etch recipes are well established in the art. Thereafter, exposed portions of the liner 107A may be removed by a further etch process, for instance based on a wet chemical etch process or any other appropriate technique, such as a high frequency plasma etch and the like. For example, appropriate etch strategies are well established for silicon dioxide, silicon nitride and the like. In other illustrative embodiments, exposed portions of the liner 107A may be removed in a subsequent etch process for creating respective recesses adjacent to the gate electrodes 105.

Figure 1B:
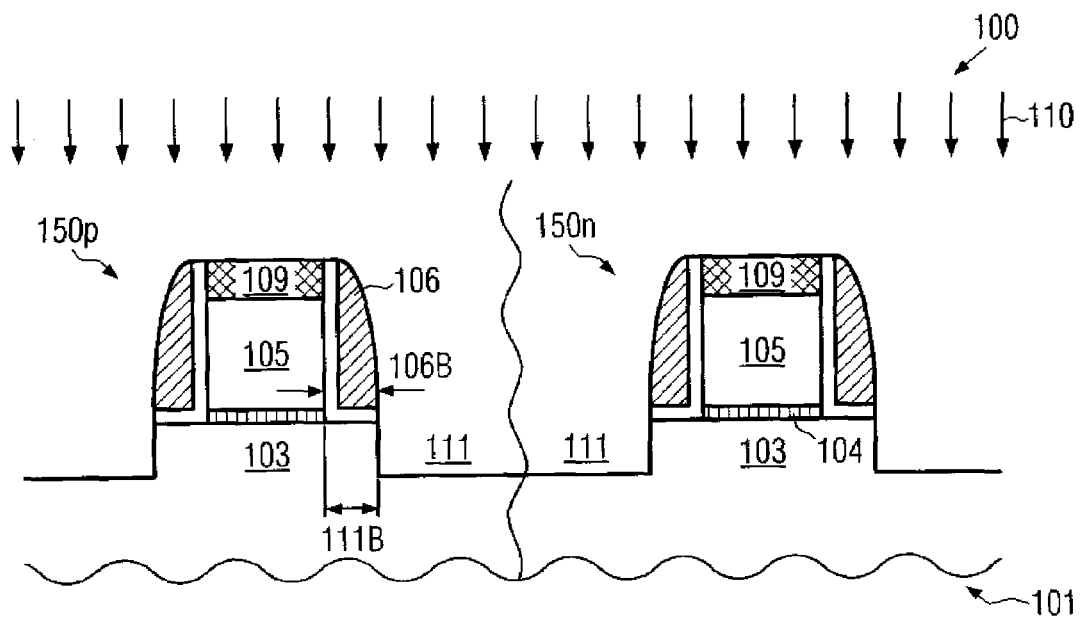

FIG. 1b schematically illustrates the semiconductor device 100 during a respective etch process 110, in which recesses 111 are formed in the layer 102 adjacent to the corresponding gate electrodes 105 on the basis of sidewall spacers 106 that have been formed from the spacer layer 106A, as was previously described. Thus, it should be understood that, throughout this description and in the appended claims, any recesses or cavities formed "adjacent to" a gate electrode include the provision of any sidewall spacer structure on the sidewall of the respective gate electrode prior to actually forming the recesses or cavities. Hence, "adjacent to" the gate electrode may enclose a lateral offset provided by a sidewall spacer structure. In some illustrative embodiments, the etch process 110 may be designed as a substantially anisotropic etch process, thereby obtaining the recesses 111 as trenches having moderately steep sidewalls, wherein an offset 111B of the recess 111 with respect to the gate electrode 105, and thus to the channel region 103, is substantially determined by a spacer width 106B, which may also include the thickness of the liner 107A. In other illustrative embodiments, the etch process 110 may be designed as a more or less isotropic process, wherein a certain degree of under-etch is achieved wherein the offset 111B is then determined by the etch parameters and the spacer width 106B. During the etch process 110, material erosion in the gate electrodes 105 may be substantially avoided by the spacers 106 and the capping layers 109.

Figure 1C:
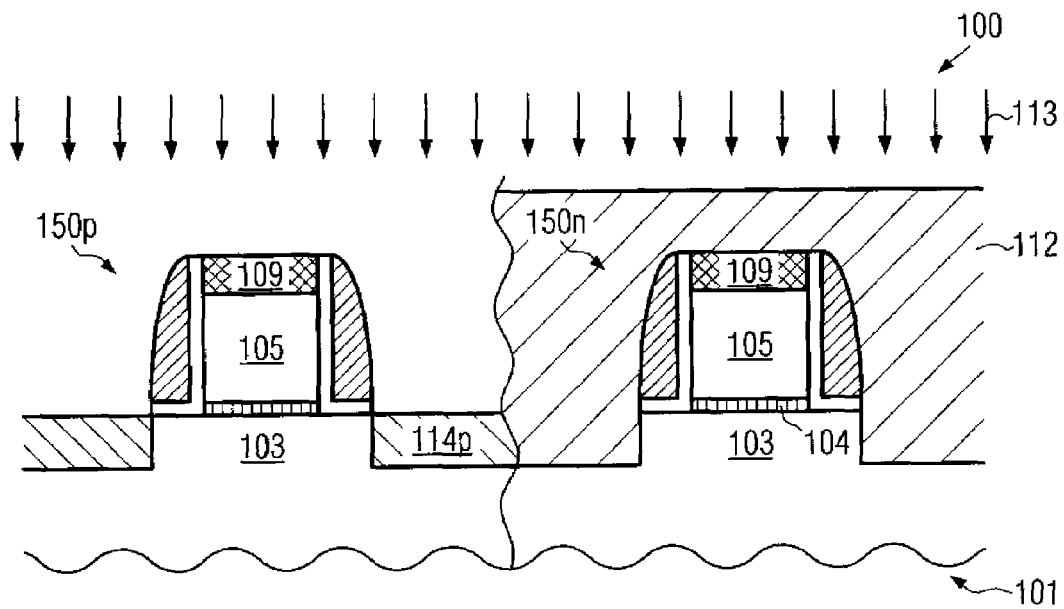

FIG. 1c schematically illustrates the semiconductor device 100 in a further advanced manufacturing stage. A growth mask 112 may be formed to cover the second transistor 150n including the recesses 111, while the first transistor 150p is exposed to the deposition ambient of a selective epitaxial growth process 113. The growth mask 112 may be comprised of any appropriate material that is configured to withstand the environmental conditions during the epitaxial growth process 113, that is, the growth mask 112 may have to tolerate temperatures up to several hundred degrees and provide a specified selectivity during the deposition of material in the process 113. For instance, silicon nitride, silicon dioxide and the like are dielectric materials for which a plurality of process parameter values are available, which may allow the selective epitaxial growth of a silicon-based material on exposed crystalline silicon areas, while a significant deposition of silicon material on dielectric materials, such as the growth mask 112, as well as the capping layer 109 and the spacer 106 of the first transistor 150p, may be avoided or reduced.

Consequently, during the process 113, a silicon-based semiconductor material may be selectively formed in the recess 111 of the first transistor 150p, wherein the underlying material of the layer 102 acts as a growth template when the semiconductor layer 102 is a silicon-based material. Moreover, during the epitaxial growth process 113, a specific non-silicon material may be added to the deposition atmosphere, at least temporarily, in order to form a semiconductor material, indicated as 114p, having a different lattice spacing in its non-strained state so that, upon growing on the crystalline template of the layer 102, the material 114p represents a strained semiconductor material, which may thus also induce a respective strain in the adjacent channel region 103. In one illustrative embodiment, the strained semiconductor material 114p may represent a compressively strained material, such as a silicon/germanium material, which may efficiently enhance charge carrier mobility in the channel region 103 when the first transistor 150p may represent a P-channel transistor. As shown, the selective epitaxial growth process 113 may be controlled such that a desired degree of filling of the recess 111 is obtained, wherein, depending on device requirements, the recess 111 may be underfilled or overfilled or may result in a substantially flush configuration.

After the growth process 113, the mask 112, which may, for instance, be comprised of silicon dioxide may be removed selectively to the material of the capping layer 109 and the spacers 106. For instance, highly selective dry and wet chemical etch processes are available for silicon dioxide, silicon nitride and the like. In still other illustrative embodiments, the first transistor 150p may be covered by a resist mask (not shown) during the removal of the mask 112 in order to avoid undue damage or material erosion in the first transistor 150p. Thereafter, any additional pre-cleaning processes may be performed in order to prepare the exposed transistor 150n for the selective growth of a further strained semiconductor material.

Figure 1D:
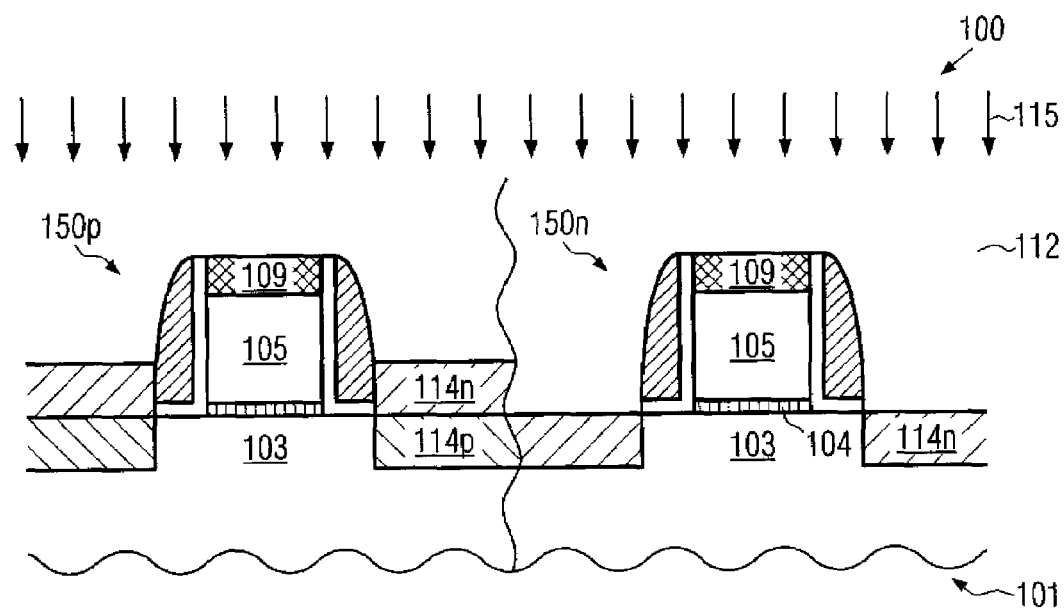

FIG. 1d schematically illustrates the semiconductor device 100 during a further selective epitaxial growth process 115, in which, at least temporarily, a semiconductor material 114n is formed in the recess 111 of the second transistor 150n, which differs in its strain characteristics from the material 114p. In one illustrative embodiment, the material 114n may be provided as a semiconductor material having a different type of strain compared to the material 114p, thereby inducing a different type of strain in the respective channel region 103 of the second transistor 150n. For instance, if the second transistor 150n may represent an N-channel transistor, the strained semiconductor material 114n may be provided as a material having a reduced lattice spacing in its non-strained state compared to the silicon-based material of the layer 102. For example, the material 114n may be deposited as a silicon/carbon material wherein a carbon content of 0.5 to several atomic percent may be incorporated into the silicon in order to obtain a desired lattice mismatch so that, when the material 114n is grown with a substantially silicon-like lattice spacing, a corresponding tensile strain is generated. It should be appreciated that the type of strain created by the selective epitaxial growth process 115, and also by the process 113, may depend on the crystalline characteristics of the template material of the layer 102. For example, if the semiconductor layer 102 itself contains a certain amount of non-silicon components, such as germanium, carbon and the like, the material composition of the materials 114p and 114n may be correspondingly selected so as to obtain the desired type of strain. In other illustrative embodiments, the first and second transistor elements 150p, 150n may be of the same conductivity type and thus require the same type of strain, whereas a different magnitude may be desirable due to device or process specific requirements. In this case, the growth processes 113 and 115 may be performed on the basis of substantially the same parameters, except for different amounts of non-silicon species in order to create a different magnitude of the same type of strain.

Moreover, as shown in FIG. 1d, during the epitaxial growth process 115, the first transistor 150p may remain exposed to the deposition ambient so that a corresponding material 114n may also be formed on top of the previously formed strained material 114p. Consequently, any complex process steps for forming a corresponding growth mask, such as the mask 112, and the removal thereof may be omitted, thereby contributing to a reduced overall process complexity. It should be noted that the material 114n and the material 114p may exhibit, in some embodiments, a different type of intrinsic strain. The influence of the "capping layer" 114n on the respective channel region 103 of the first transistor 150p is, however, significantly less compared to the strained material 114p, which may substantially directly act on the channel region 103. In some embodiments, the effect of the capping material 114n above the layer 114p may be considered inappropriate for the performance of the first transistor 150p. Thus, in some illustrative embodiments, the material 114n may be deposited with a thickness that is appropriate for being consumed in a later manufacturing stage, for instance for the formation of metal silicide in the first transistor 150p, as will be described later on in more detail.

Thereafter, depending on process strategy, the spacers 106 may be used for the formation of drain and source regions by ion implantation, while, in other illustrative embodiments, the spacers 106 may be removed by appropriate selective dry and/or wet chemical etch processes prior to forming respective drain and source regions. For instance, drain and source implantations may be performed on the basis of the spacers 106, wherein respective extension regions (not shown) may have been formed prior to the formation of the strained semiconductor materials 114p, 114n. In other embodiments, respective extension regions, if required, may be formed after the removal of the spacers 106, irrespective of whether these spacer elements may have been used as implantation masks for the formation of deep drain and source regions.

Figure 1E:
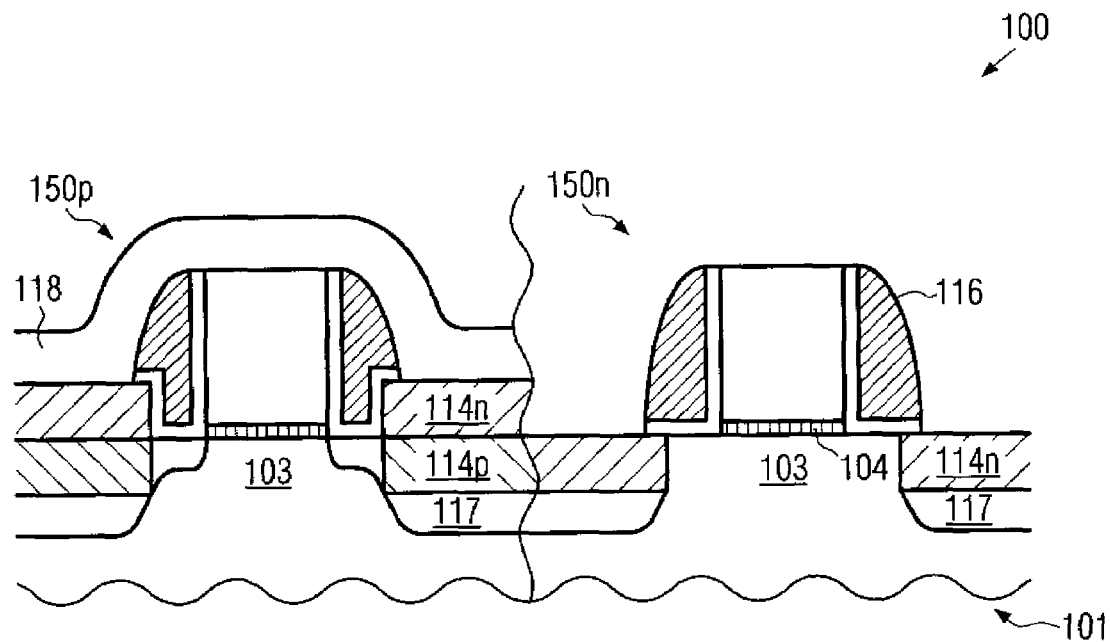

FIG. 1e schematically illustrates the semiconductor device 100 in a further advanced manufacturing stage, in which a spacer structure 116 is formed on the respective gate electrodes 105 of the first and second transistors 150p, 150n. Moreover, drain and source regions 117 may be formed in the strained semiconductor materials 114p, 114n and in the semiconductor layer 102, wherein the lateral profiling of the drain and source regions 117 may have been accomplished on the basis of the spacer structure 116, which may include two or more individual spacer elements (not shown), or which may also be accomplished on the basis of the spacers 106, as previously explained. Moreover, the device 100 may comprise a layer of refractory metal 118, which may be formed above the first transistor 150p having the "capping" layer 114n formed above the respective drain and source regions 117. In this illustrative embodiment, the metal layer 118 may not be formed above the second transistor 150n so as to allow individually adjusting a corresponding silicidation process with respect to the characteristics of the material 114n located above the material 114p in the first transistor 150p.

The device 100 as shown in FIG. 1e may be formed on the basis of the following processes. The drain and source regions 117 having a specified vertical and horizontal dopant profile according to device requirements may be formed on the basis of the spacers 106 and/or 116, as previously described, wherein well-established implantation processes may be used, wherein, in some embodiments, a certain dopant species may also be incorporated during the selective epitaxial growth processes 113 and 115. Thereafter, respective anneal processes may be performed to activate the dopants in the regions 117 and also to re-crystallize implantation-induced damage according to device requirements.

Thereafter the layer 118, which may be comprised of any appropriate refractory metal, such as nickel, nickel/platinum, platinum, cobalt and the like, may be deposited on the basis of well-established techniques such as sputter deposition and the like, wherein a thickness of the layer 118 may be selected on the basis of the material 114n formed above the material 114p so as to convert a desired amount thereof into a respective metal silicide. For example, the layer 118 may be deposited and may afterwards be patterned on the basis of a lithography process so as to remove the layer 118 from the second transistor 150n. In still other examples, a respective lithography mask may be formed prior to the deposition of the layer 118 and a respective patterning of the layer 118 may be achieved by depositing the material on the device 100 and removing the lithography mask together with any metal material deposited thereon.

Thereafter, an appropriate heat treatment may be performed to initiate the conversion of the material 114n in the first transistor 150p into a respective metal silicide. For instance, if the strained material 114n may be comprised of silicon/carbon including a moderately low amount of carbon, as specified above, a respective metal silicide may be formed. In other illustrative embodiments, prior to initiating a chemical reaction between the layer 118 and the underlying silicon-containing material, a further refractory metal layer (not shown) may be deposited with a required thickness so as to meet the corresponding device requirements of the second transistor 150n so that metal silicides of different characteristics may be formed in the first and second transistors 150p, 150n in a common heat treatment. For example, the same or a different refractive material may be deposited and subsequently a corresponding heat treatment may be performed, during which respective process parameters, in particular the duration of the heat treatment, may be selected such that a desired amount of the material 114n in the first transistor 150p is converted into a metal silicide, while in the second transistor 150n the corresponding reaction, i.e., the amount of metal silicide obtained, may be substantially determined by the amount of refractory metal provided at the second transistor 150n.

Figure 1F:
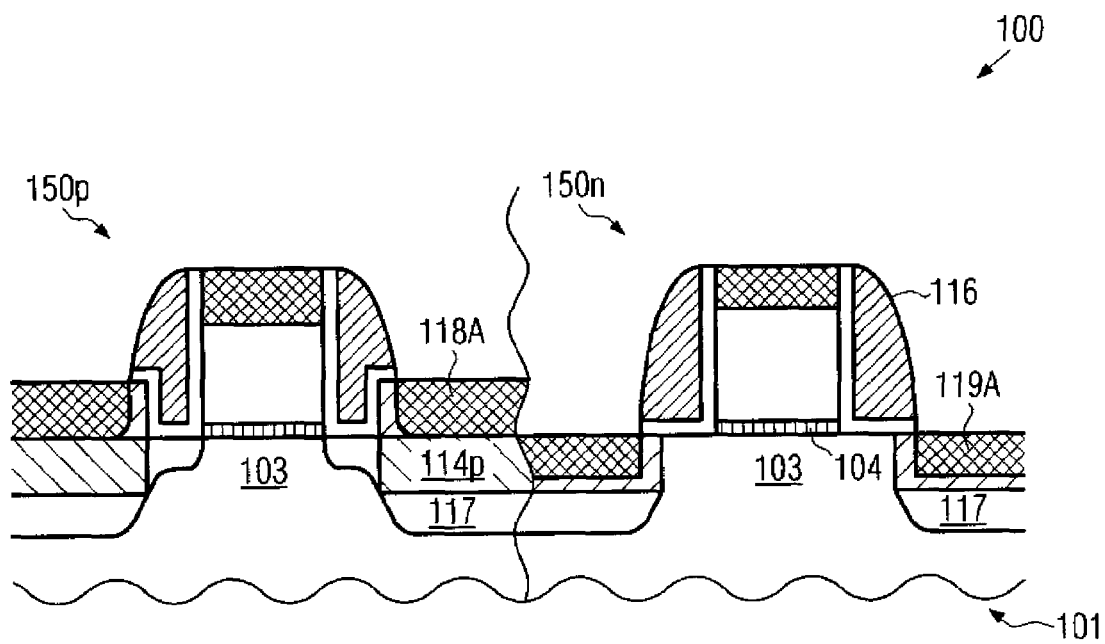

FIG. 1f schematically shows the semiconductor device 100 after completion of the above-described process sequence. Hence, the device 100 comprises respective metal silicide regions 118A in the first transistor 150p, wherein a specified amount of the material 114n may be converted into a metal silicide, while the second transistor 150n may have formed therein respective metal silicide regions 119A, which correspond to the device requirements of this transistor. Consequently, the non-desired effect of the strained material 114n in the first transistor 150p may be significantly reduced by forming a highly conductive metal silicide therein, thereby also providing the potential for specifically increasing the performance of the first transistor 150p, since the respective gate electrode 105 may also have an increased amount of metal silicide. On the other hand, the second transistor 150n may have the metal silicide regions 119A complying with transistor specific requirements, wherein the remaining strained material 114n provides the desired type and magnitude of strain in the respective channel region 103. Consequently, the performance characteristics of the transistors 150p, 150n may be adjusted in a highly uncorrelated manner while at the same time the process complexity is significantly reduced due to the omission of at least one epitaxial growth mask and any process steps associated therewith. If, for example, the first transistor 150p represents a P-channel transistor, a high degree of compressive strain may be generated by the strained material 114p, while, additionally, a high conductivity of the gate electrode 105 and the respective contact regions of the drain and source regions 117 is achieved, while the performance of the transistor 150n may be enhanced by providing the material 114n having a desired magnitude of tensile strain.

With reference to FIGS. 2a-2i, further illustrative embodiments will now be described in more detail, in which a strained semiconductor material of different strain characteristics may be formed adjacent to respective gate electrodes in a highly efficient manner, thereby enabling the positioning of the strained material close to the channel region, which may be highly advantageous in the context of fully depleted and partially depleted transistor elements, which are formed on the basis of thin semiconductor layers.

Figure 2A:
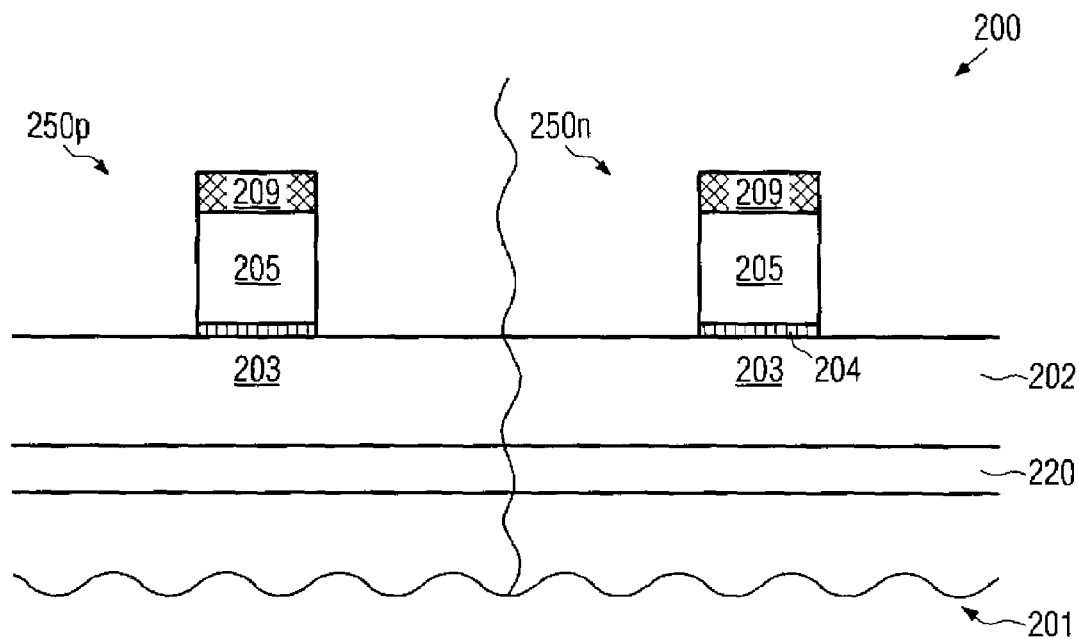
FIGS. 2a-2i schematically depict cross-sectional views of a semiconductor device including two different transistor types during various manufacturing stages, in which each transistor type receives a different strained semiconductor material on the basis of a disposable spacer approach according to further illustrative embodiments of the present invention.

FIG. 2a schematically shows a cross-sectional view of a semiconductor device 200 comprising a substrate 201 having formed thereon, in one illustrative embodiment, a buried insulating layer 220, above which is formed a semiconductor layer 202. Thus, in this configuration, the device 200 may represent an SOI-like device, wherein, in some illustrative embodiments, the semiconductor layer 202 may have characteristics for forming partially or fully depleted transistor elements thereon and therein. Hence, a thickness of the semiconductor layer 202, if a silicon-based device is considered, may be approximately 100 nm and significantly less in advanced applications. Moreover, a first transistor 250p and a second transistor 250n may be provided, wherein, in this manufacturing stage, respective gate electrodes 205 are formed on respective gate insulation layers 204. Furthermore, respective capping layers 209 may be formed on the respective gate electrodes 205. For forming the device 200 as shown in FIG. 2a, substantially the same processes may be used as are previously described with reference to the device 100.

Figure 2B:
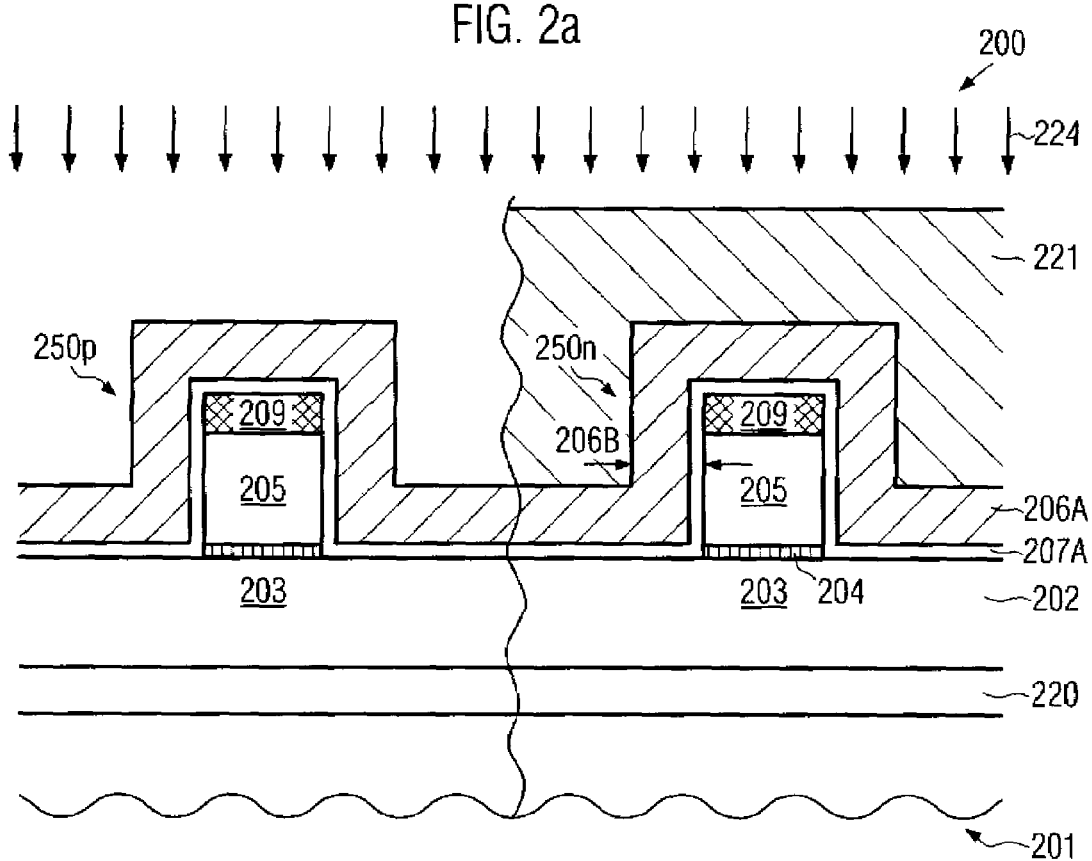

FIG. 2b schematically illustrates the device 200 in a further advanced manufacturing stage. Here, a first spacer layer 206A, possibly in combination with a respective liner 207A, may be formed on the first and second transistors 250p, 250n. Moreover, the second transistor 250n may be covered by a mask 221, such as a resist mask and the like, which may expose the first transistor 250p to an anisotropic etch ambient 223, while substantially protecting the second transistor 250n. The spacer layer 206A including the liner 207A may be formed on the basis of well-established deposition techniques, such as plasma enhanced chemical vapor deposition (PECVD), wherein a thickness of the conformal spacer layer 206A may be selected to provide a desired offset for a recess to be formed adjacent to the gate electrode 205 of the first transistor 250p in a subsequent etch process. For example, a thickness 206B of the layer stack 206A, 207A may range from several nanometers, for instance 3-50 nm, depending on the specific application. Thereafter, the mask 221 may be formed on the basis of any appropriate material, such as photoresist and the like, using well-established photolithography techniques for patterning a corresponding material layer, thereby forming the mask 221. Next, the etch process 223 may be performed on the basis of well-established anisotropic etch techniques, wherein the etch process 223 may be reliably stopped in and on the liner 207A. Thereafter, the mask 221 may be removed, for instance on the basis of oxygen plasma-based techniques and the like, and thereafter exposed portions of the layer 207A may be removed from the first transistor 250p. In other embodiments, the removal of the liner 207A may be performed during or after the etch process 223 and the corresponding mask 221 may be subsequently removed.

Figure 2C:
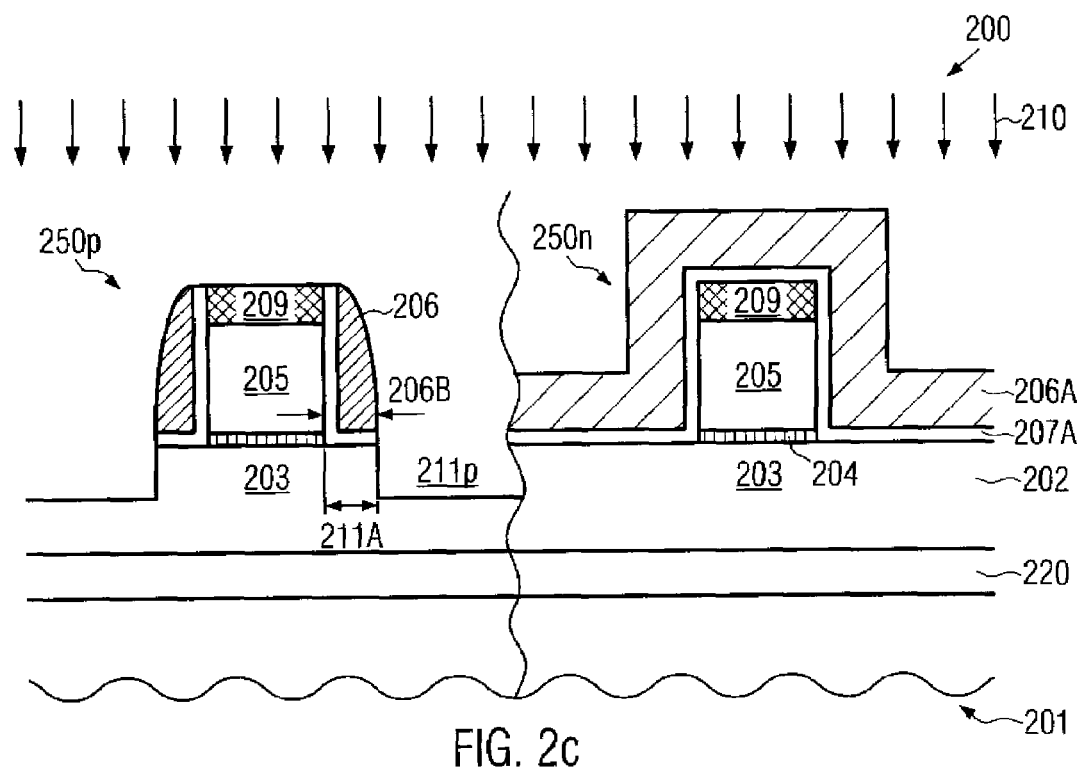

FIG. 2c schematically illustrates the semiconductor device 200 after the completion of the above-described process sequence. Hence, the transistor 250p comprises respective spacer elements 206 having a width that substantially corresponds to the thickness 206B, while the second transistor 250n is still covered by the spacer layer 206A. Moreover, the device 200 is exposed to a further etch ambient 210 in order to form respective recesses or cavities 211p in the first transistor 250p. As previously explained, an offset 211A of the recess 211p with respect to the gate electrode 205 and thus the channel region 203 is influenced by the spacer width 206B, and may be substantially determined thereby if the etch process 210 is a substantially anisotropic process. On the other hand, if the process 210 comprises an isotropic component, the shape of the recess 211p and thus the offset 211A may also depend on the process parameters of the etch process 210. Consequently, the characteristics of the recess 211p may be individually adapted in accordance with device requirements corresponding to the first transistor 250p, while the second transistor 250n is reliably covered by the spacer layer 206A. After the formation of the recess 211p, any cleaning processes may be performed to prepare the device 200 for the formation of a strained semiconductor material in the recess 211p.

Figure 2D:
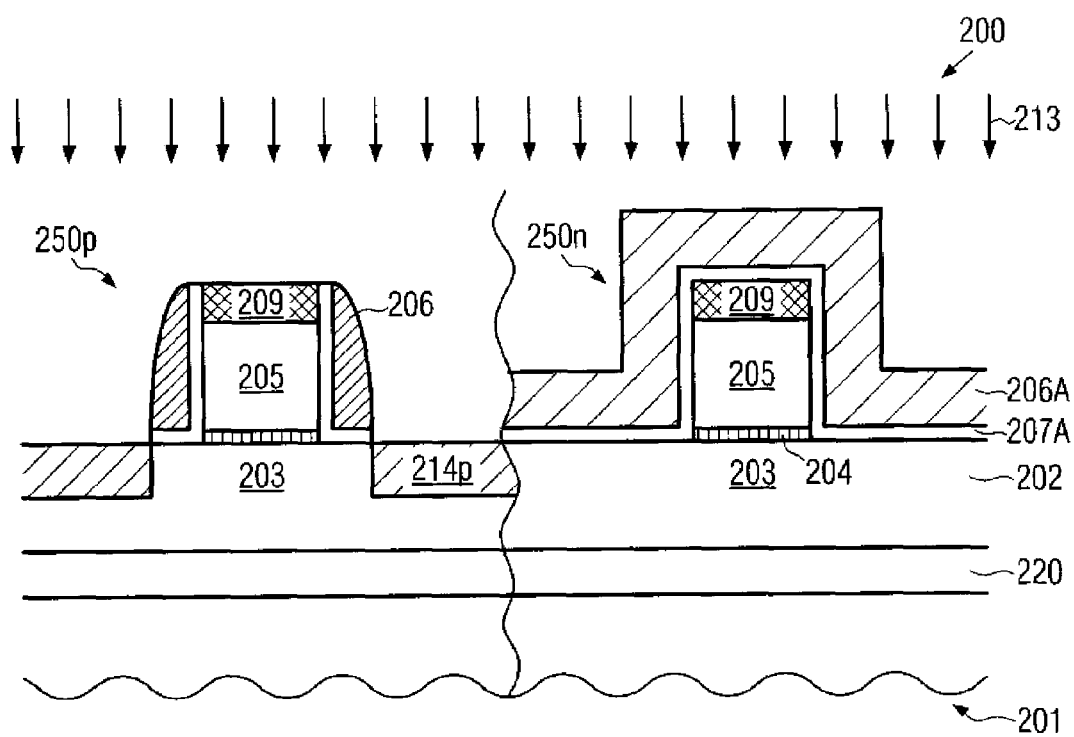

FIG. 2d schematically illustrates the device 200 during an epitaxial growth process 213 for forming a strained semiconductor material 214p in the recess 211p, wherein, as previously explained with reference to the device 100, any desired degree of underfilling or overfilling or a substantially flush configuration may be accomplished. With respect to the type of strained semiconductor material 214p, the same criteria apply as previously explained. For instance, the material 214p may represent a silicon/germanium material with a high intrinsic compressive strain. After the epitaxial growth process 213, the spacer layer 206A may be removed on the basis of any appropriate selective etch process. For instance, wet chemical etch processes for silicon nitride are well established in the art. Consequently, during a corresponding wet chemical etch process, the layer 206A may be removed selectively to the liner 207A, while, in the first transistor 250p, the spacers 206 as well as the capping layer 209, if comprised of silicon nitride, may also be removed.

Figure 2E:
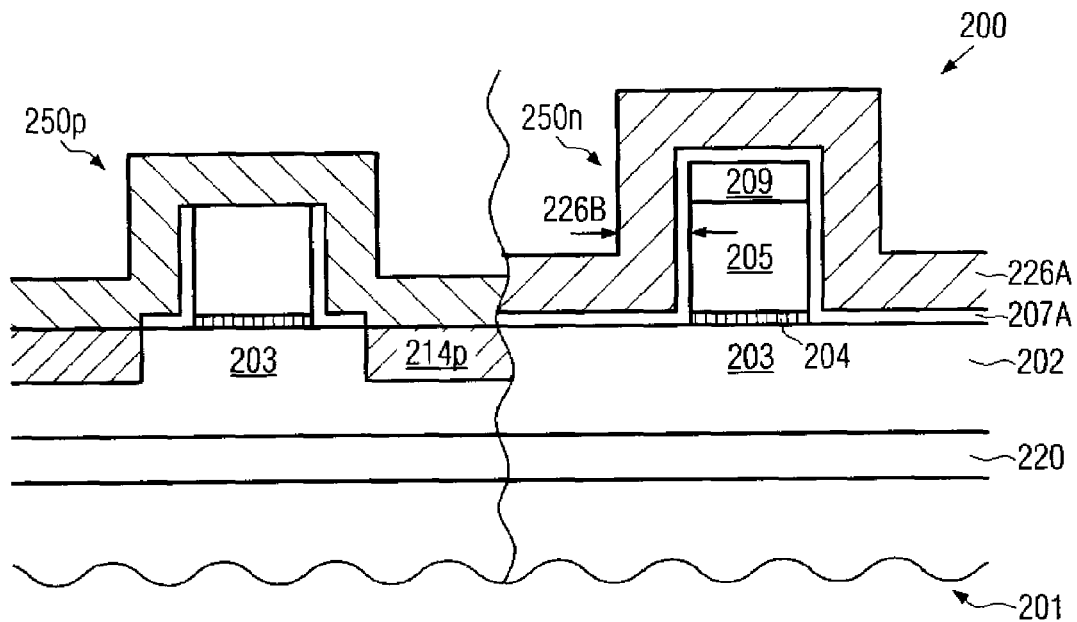

FIG. 2e schematically illustrates the semiconductor device 200 after the completion of the above-described process sequence and with a further spacer layer 226A, for instance comprised of silicon nitride and the like, wherein a thickness of the spacer layer 226A, indicated as 226B, may be selected on the basis of device requirements of the second transistor 250n, since the thickness 226B may substantially determine the resulting width of spacers formed from the layer 226A in the second transistor 250n. Consequently, as previously explained, respective characteristics of a recess to be formed in the second transistor 250n may be adjusted substantially independently from respective characteristics of the first transistor 250p.

Figure 2F:
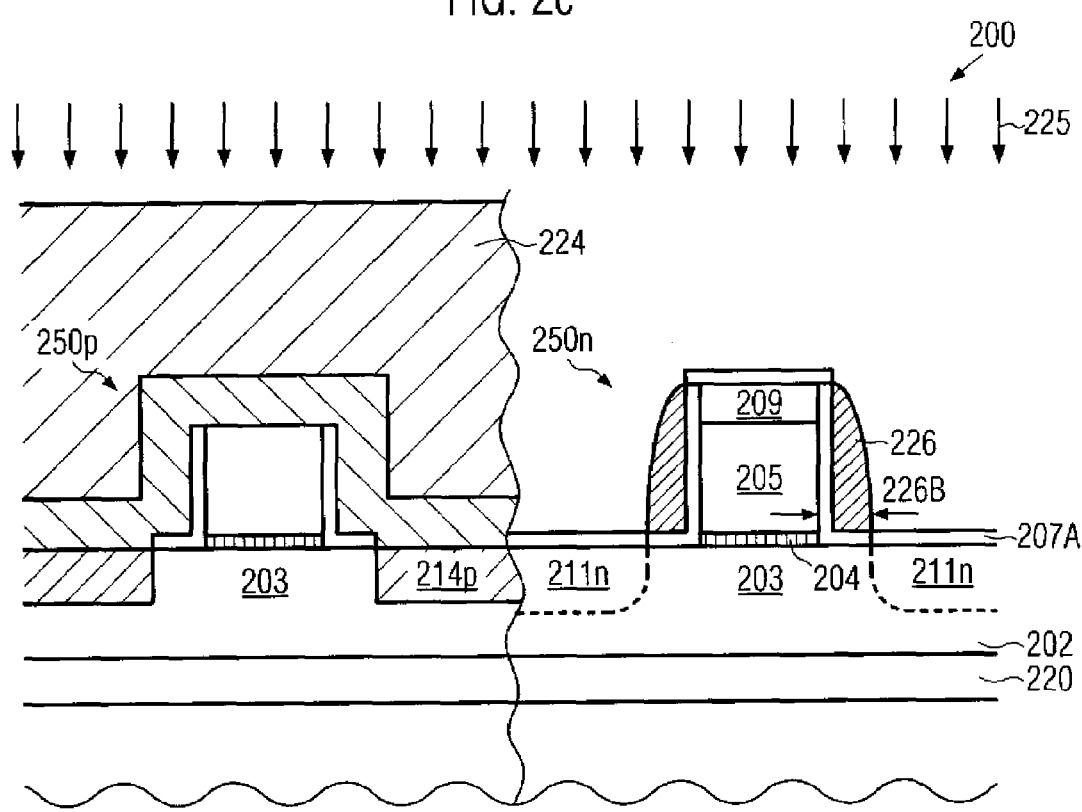

FIG. 2f schematically illustrates the device 200 in a further advanced manufacturing stage, wherein a further mask 224, such as a resist mask or any other appropriate mask, is formed to cover the first transistor 250p while exposing the second transistor 250n to an anisotropic etch ambient 225. Consequently, the spacer layer 226A is etched in order to form respective spacers 226, the width of which is substantially determined by the thickness 226B and thus the corresponding width will also be indicated as 226B. It should be appreciated that, in some illustrative embodiments, the liner 207A, previously formed in combination with the spacer layer 206A, may still be present and may be used for etching the spacer layer 226A, while, in other illustrative embodiments, after the removal of the spacer layer 206A and the respective spacers 206, a corresponding liner (not shown) may be formed on the first and second transistors 250p, 250n prior to the deposition of the spacer layer 226A. In this case, the gate electrode 205 of the first transistor 250p and the strained semiconductor material 214p may also be covered by the newly formed liner material. After the etch process 225, exposed portions of the liner 207A may be removed and the mask 224 may be subsequently removed on the basis of processes as are previously described. Thereafter, a further etch process may be performed to form a respective recess or cavity 211n, as indicated in dashed lines, wherein the respective size and offset of the recesses 211n is influenced by the spacer width 226B and possibly by the process parameters of the corresponding cavity etch process, as is also explained with reference to the recesses 211p. Consequently, the size and the offset of a correspondingly strained semiconductor material may be defined on the basis of the spacers 226. For instance, the width 226B may range from approximately several nanometers, such as 3-50 nm, depending on the process requirements.

Figure 2G:
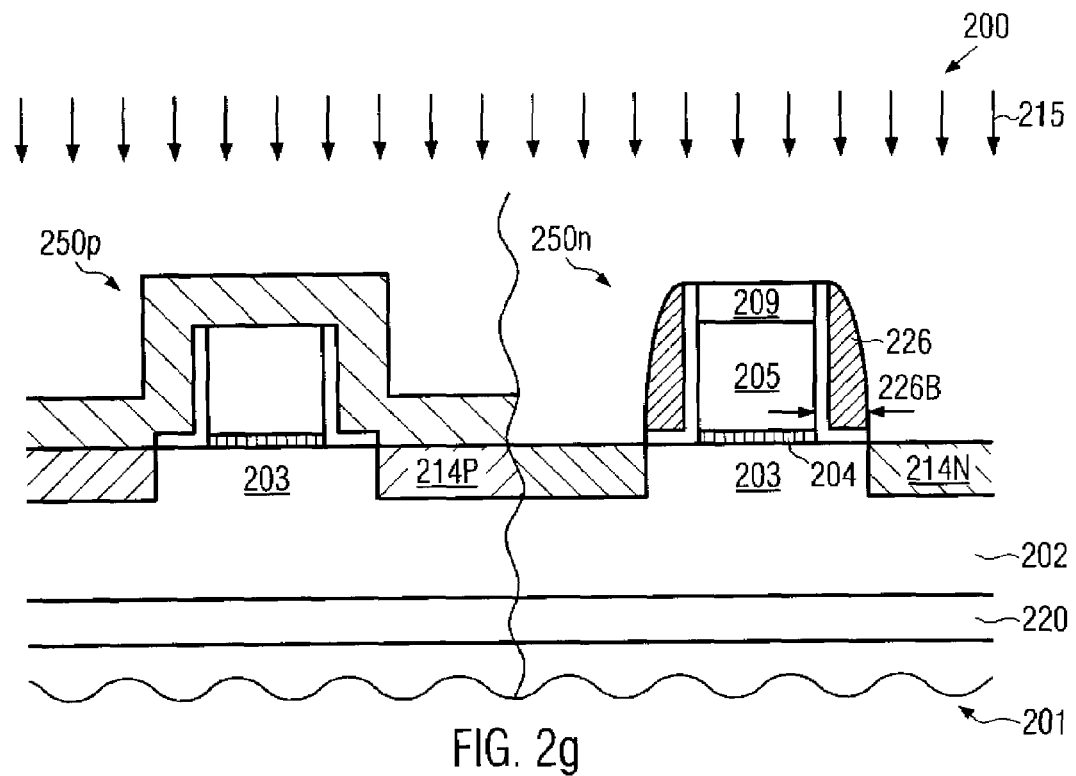

FIG. 2g schematically illustrates the device 200 in a further advanced manufacturing stage, wherein the device 200, after a corresponding cavity etch process for actually forming the recesses 211n, is subjected to a further selective epitaxial growth process 215 for forming a strained semiconductor material 214N adjacent to the respective channel region 203 of the second transistor 250n, while the first transistor 250p is covered by the spacer layer 226A. With respect to the epitaxial growth process 215, the same criteria apply as previously explained. For instance, the semiconductor material 214N may have a different type of strain and/or may have a different magnitude of strain compared to the material 214P. In some illustrative embodiments, the strained semiconductor material 214N may comprise a silicon/carbon mixture for imposing a tensile strain to the channel region 203 of the second transistor 250n.

Figure 2H:
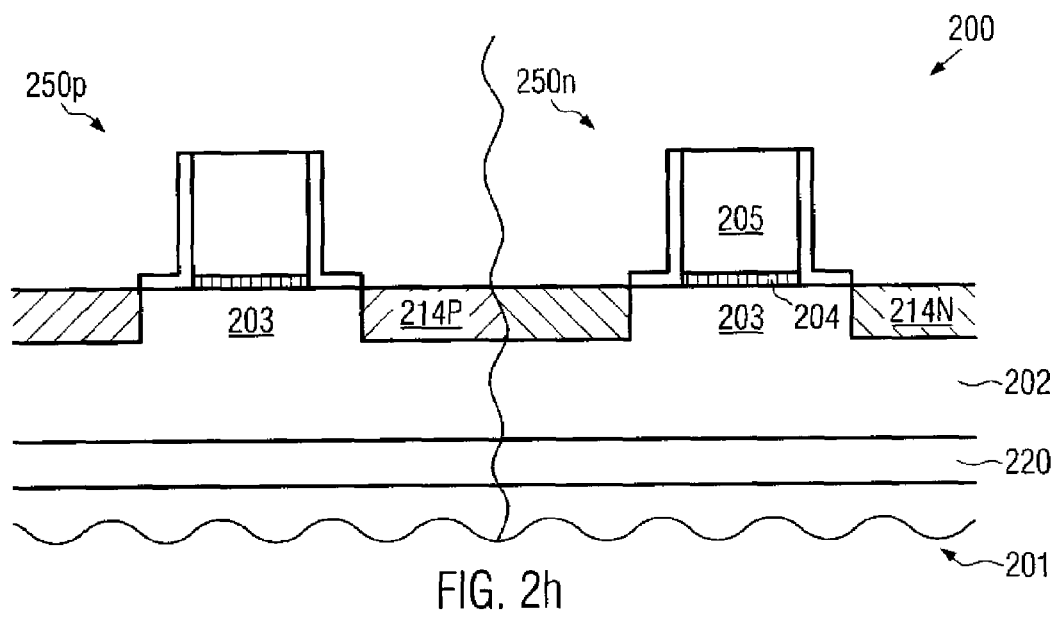

FIG. 2h schematically illustrates the device 200 in a further advanced manufacturing stage, in which the spacer layer 226A and the spacers 226 have been removed by an appropriate selective etch process, for instance on the basis of a wet chemical etch process, such as a process comprising hot phosphoric acid and the like when the spacer layer 226A is substantially comprised of silicon nitride. Moreover, during the corresponding removal process, the capping layer 209 of the gate electrode 205 of the second transistor 250n may also be removed. Thereafter, the further processing may be continued by forming source and drain regions in the semiconductor layer 202 and within the strained semiconductor materials 214P, 214N on the basis of appropriate spacer techniques and implantation processes.

Figure 2I:
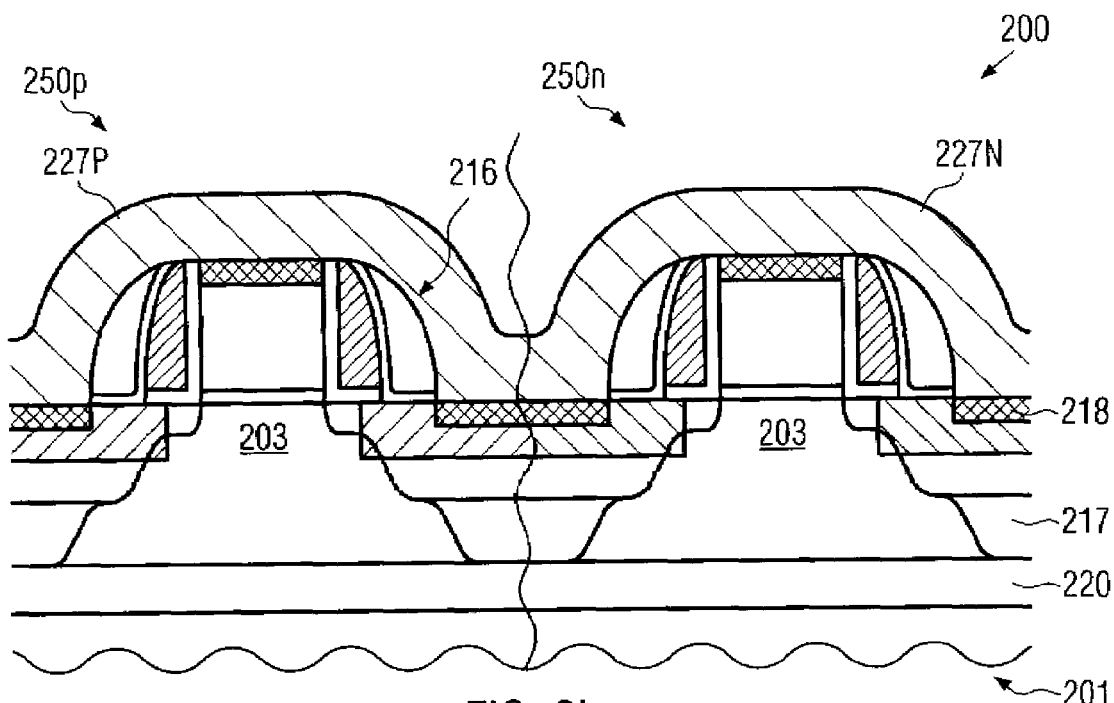

FIG. 2i schematically illustrates the device 200 with a corresponding sidewall spacer structure 216 formed on the respective gate electrodes 205, which may have been used for defining respective lateral and vertical dopant profiles for respective drain and source regions 217. It should be appreciated that the spacer structures 216 may comprise any appropriate number of individual spacer elements, depending on the complexity of the required dopant profile of the regions 217. Furthermore, the first and second transistors 250p, 250n may be covered by a dielectric material, which, in one illustrative embodiment, may be provided as layer portions 227P, 227N having different intrinsic stresses in order to enhance the strain created in the respective channel regions 203. For example, the layer portions 227P, 227N may comprise silicon nitride, which may be formed so as to include a high intrinsic stress, compressive or tensile, thereby acting as a further stress source for the transistors 250p, 250n. Thus, in illustrative embodiments, the transistor 250p may represent a P-channel transistor, wherein the strained semiconductor material 214P may be a compressive material and the layer portion 227P may include a high compressive stress. Similarly, if the second transistor 250n represents an N-channel transistor, the strained material 214N may comprise tensile strain and the layer portion 227N may exhibit a high tensile stress. Moreover, respective metal silicide regions 218 may be formed in the drain and source regions 217 and the gate electrodes 205.

The metal silicide regions 218 and the layer portions 227P, 227N may be formed on the basis of well-established recipes, wherein, during the formation of the layers 227P, 227N, process parameters, such as deposition temperature, ion bombardment, pressure and the like, may be varied to obtain the required type of intrinsic stress. Furthermore, respective masking schemes may be applied to first form one of the layers 227P, 227N and subsequently remove an unwanted portion thereof and thereafter form the other of the portions 227P, 227N, followed by the removal of an unwanted portion thereof. Consequently, the device 200 may be formed to have a high degree of strain with the respective channel regions 203, which may be selected to be different at least in one of magnitude and type for the first and second transistors 250p, 250n, wherein the position of the respective strained semiconductor materials 214p, 214n may be selected individually, which may be highly advantageous for SOI-like transistor architectures, as shown in FIGS. 2a-2i, since here a depth of the strained semiconductor material 214p, 214n may be restricted due to the restricted thickness of the layer 202, of which a significant portion has to be maintained for the respective epitaxial growth processes 213, 215. Hence, for a reduced thickness of the semiconductor layer 202, as may be required for fully and partially depleted SOI transistors in advanced applications, nevertheless an efficient strain-inducing mechanism may be obtained due to the close proximity of the strained semiconductor materials 214p, 214n to the respective channel regions 203, wherein an individual positioning may be accomplished by the above-described process sequence.

With reference to FIGS. 3a-3d, further illustrative embodiments of the present invention will be described in more detail, wherein process complexity for selective epitaxial growth processes for different types of transistors may be reduced by providing at most one growth mask that is formed on the basis of lithography, while other growth masks may be formed in a highly efficient manner.

Figure 3A:
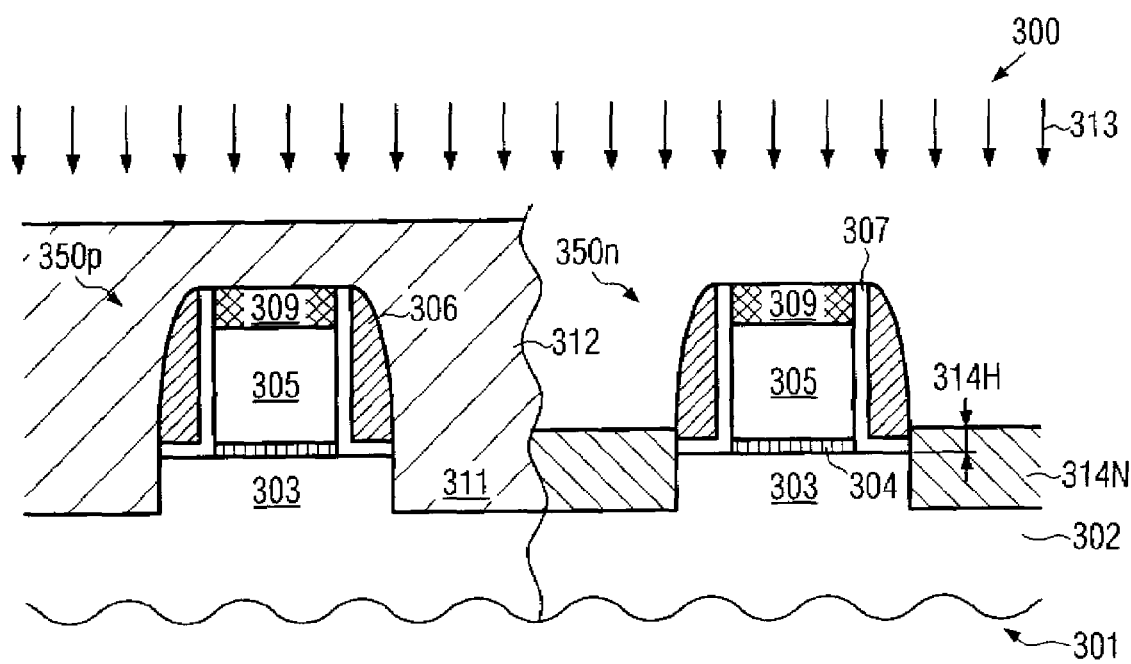
FIGS. 3a-3d schematically illustrate cross-sectional views of a semiconductor device including different transistor types during the formation of strained semiconductor material on the basis of respective epitaxial growth masks formed on the basis of a highly efficient manufacturing process in accordance with yet other illustrative embodiments.

FIG. 3a schematically illustrates a semiconductor device 300 at an intermediate manufacturing stage. The device 300 comprises a first transistor 350p and a second transistor 350n, which may be formed above a substrate 301 having formed thereon a respective semiconductor layer 302. Moreover, the first and second transistors 350p, 350n may comprise respective gate electrodes 305 covered by capping layers 309 and sidewall spacers 306, possibly in combination with a respective liner 307. Moreover, respective gate insulation layers 304 may be provided between the gate electrodes 305 and respective channel regions 303. Regarding the characteristics and any details for forming the device 300 as shown in FIG. 3a, the same criteria apply as previously explained with the corresponding components of the devices 100 and 200. Moreover, in this manufacturing stage, the first transistor 350p may have formed adjacent to the channel region 303 a respective recess 311 and a growth mask 312 to cover the first transistor 350p while exposing the second transistor 350n to a deposition ambient of a selective epitaxial growth process 313. In one illustrative embodiment, the mask 312 may be provided in the form of a silicon dioxide mask, while in other embodiments any other appropriate materials may be used.

Consequently, during the selective epitaxial growth process 313, a deposition of semiconductor material on the mask 312 is substantially suppressed, while a corresponding strained semiconductor material 314N may grow within a corresponding recess formed in the second transistor 350n. Regarding any specifics of the growth process 313 and the strained semiconductor material 314N, the same criteria apply as previously explained with reference to the devices 100 and 200. For instance, the strained semiconductor material 314N may comprise a silicon/carbon mixture, at least partially, so as to provide an intrinsic tensile strain when the semiconductor layer 302 is a silicon layer. In one illustrative embodiment, the strained semiconductor material 314N may be provided with a specific excess height 314H, which may be used for converting material therein into a dielectric capping layer in a later stage. Moreover, in some illustrative embodiments, the material corresponding to the excess height 314H may be provided in the form of a silicon material, when the presence of a non-silicon species may be considered inappropriate for the further processing of the material representing the excess height 314H. It should be noted that the excess height 314H may not necessarily represent an additional height with respect to a substantially flush transistor configuration and may also accommodate any recessed or raised configurations of the finally obtained strained semiconductor material 314N.

Figure 3B:
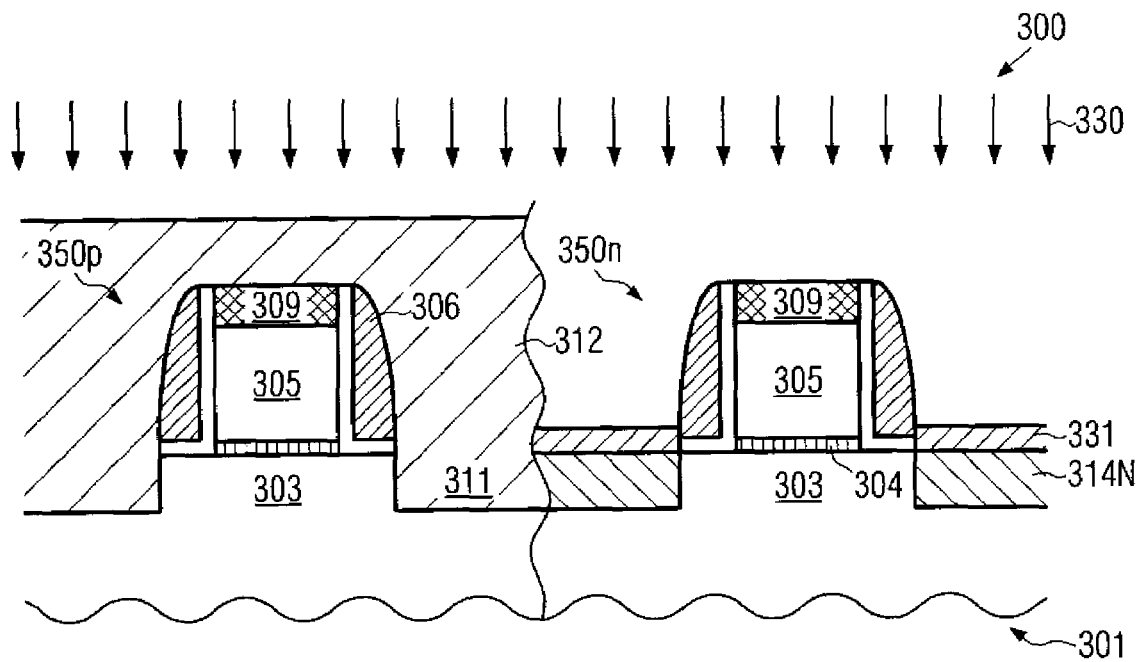

FIG. 3b schematically illustrates the semiconductor device 300 subjected to a surface modification process 330, acting on the exposed semiconductor material 314N. For instance, in one illustrative embodiment, the modification process 330 may represent a nitridation process for selectively forming a respective nitrogen-enriched surface on the strained semiconductor material 314N. As previously explained, the excess height 314H may be provided to represent a surface portion of the material 314N, which may be available for a conversion into a dielectric capping layer, such as a silicon nitride-like layer 331, that may be formed during the process 330. For example, as previously explained, the material 314N may be provided in the form of a silicon/carbon mixture so that the corresponding nitridation process 330 may result in a corresponding silicon nitride layer including a certain amount of carbon. In still other illustrative embodiments, the excess height 314H may be formed substantially of pure silicon, irrespective of the type of material previously deposited during the epitaxial growth process 313, so as to provide enhanced process flexibility with respect to the material 314N. For example, if a silicon/germanium mixture has been grown in the second transistor element 350n, which may require a substantial amount of germanium, the additional excess height 314H may nevertheless provide the required conditions so as to effectively form the silicon nitride-based material 331. During the process 330, the mask 312, when, for instance, comprised of silicon dioxide, may be affected significantly less by the process 330 compared to the material 314N so that a high degree of etch selectivity between the material 331 and the mask layer 312 may still be achieved. Consequently, during a subsequent highly selective etch process, the mask 312 may be removed on the basis of well-established etch recipes, while the gate electrode 305 and the regions 314N may be effectively protected by the layer 331, the capping layer 309 and the spacers 306. Consequently, the mask 312 may be formed on the basis of a lithography process so as to act as a growth mask during the process 313 and may also act as a mask for forming the layer 331, which, in turn, may act as an epitaxial growth mask in a further growth process for forming a respective strained semiconductor material in the first transistor 350p. In the illustrative embodiments described above, the mask 312 may also be removed without any further lithography processes by using the high etch selectivity between the material 331 and the mask 302. In other embodiments, the mask 312 may be removed on the basis of a corresponding resist mask (not shown) covering the second transistor 350n, when an exposure of this transistor is considered inappropriate during the removal of the mask 312.

Figure 3C:
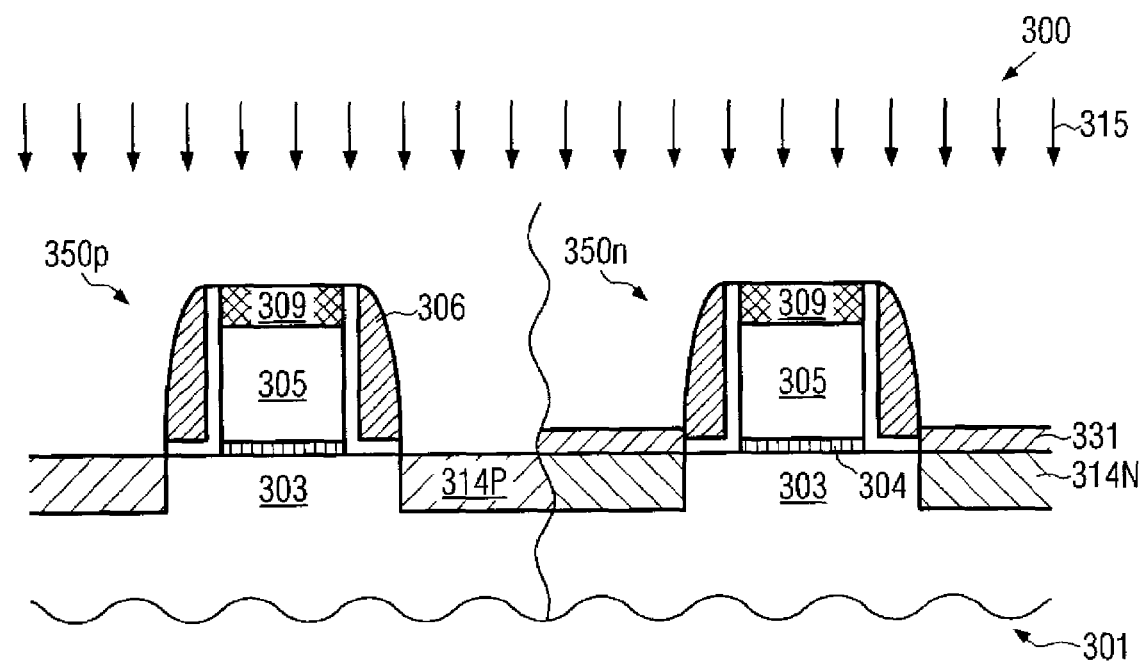

FIG. 3c schematically illustrates the semiconductor device 300 after the completion of the above-described process sequence and during a further selective epitaxial growth process 315 for forming a strained semiconductor material 314P in the first transistor 350p. During the process 315, the material layer 331 may act as an efficient growth mask, thereby substantially avoiding any material deposition thereon. With respect to the epitaxial growth process 315 and the strained semiconductor material 314P, the same criteria apply as previously explained with reference to the devices 100 and 200.

Figure 3D:
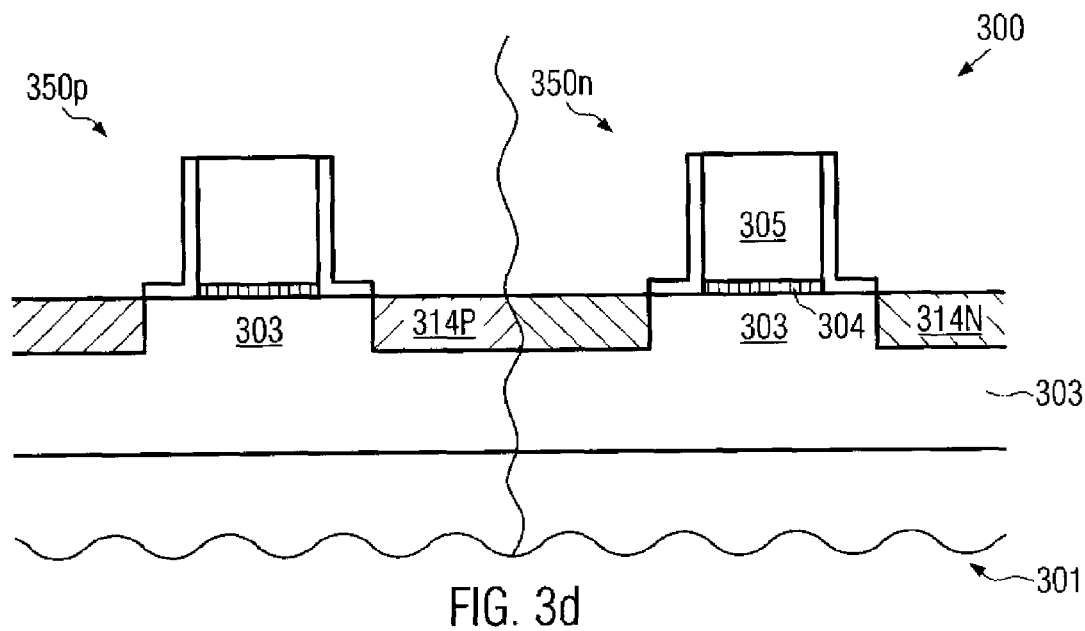

FIG. 3d schematically illustrates the semiconductor device 300 after the selective removal of the cap layers 309, the spacers 306 and the layer 331. As previously explained, highly selective wet chemical etch processes for silicon nitride-based materials are well established in the art and may be used for this purpose. Consequently, the strained materials 314P, 314N may be formed on the basis of two selective epitaxial growth processes, wherein a reduced process complexity is obtained, since at least one epitaxial growth mask, i.e., the layer 331, may be formed in a highly local fashion without requiring an additional lithographical patterning process. Furthermore, the removal of the "growth mask" 331 may be performed in a common etch process for removing the spacers 306 and the capping layer 309, thereby also significantly contributing to a reduced process complexity. Based on the device as shown in FIG. 3d, the further processing may be continued by forming respective drain and source regions, based on respective spacer techniques, as is also described with reference to the devices 100 and 200.

Figure 4A:
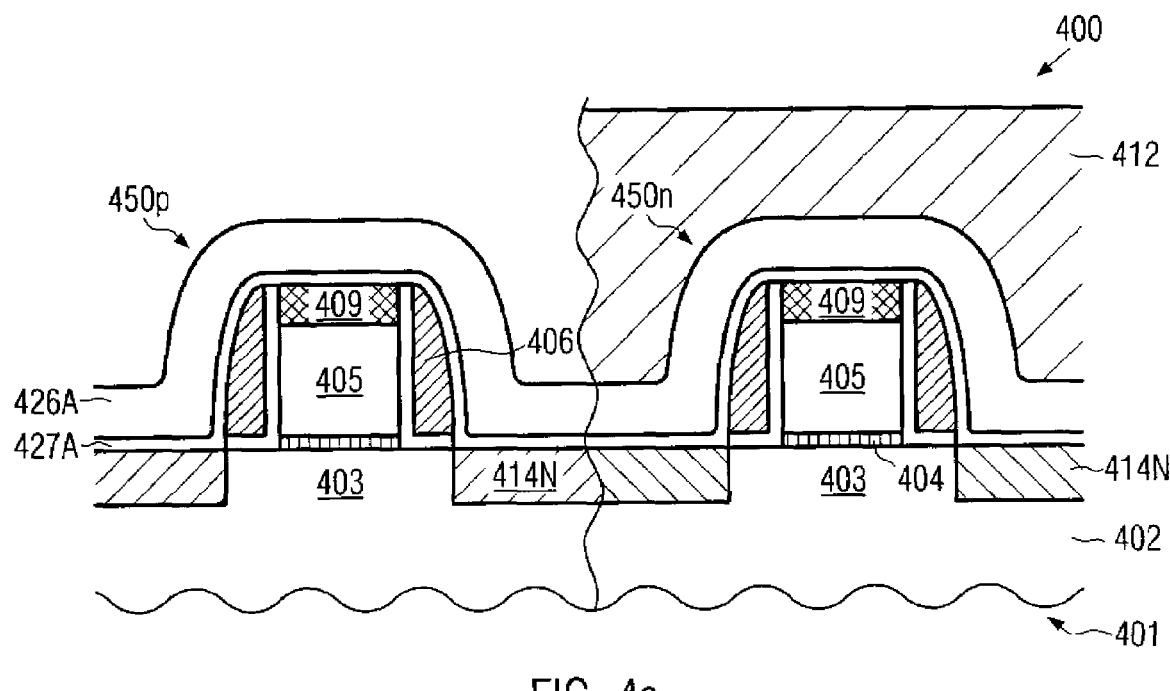
FIGS. 4a-4c schematically illustrate cross-sectional views of a semiconductor device including different transistor types receiving differently strained semiconductor layers on the basis of one or more hard masks not patterned by lithography according to yet other illustrative embodiments.
Figure 4B:
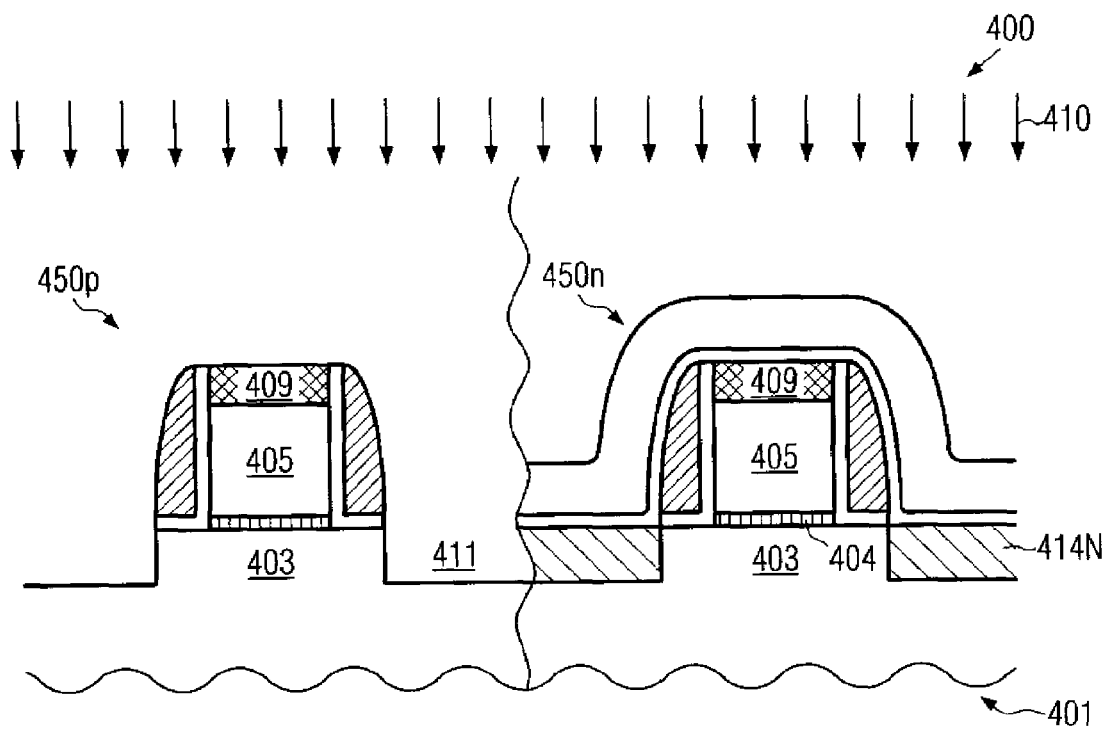
Figure 4C:
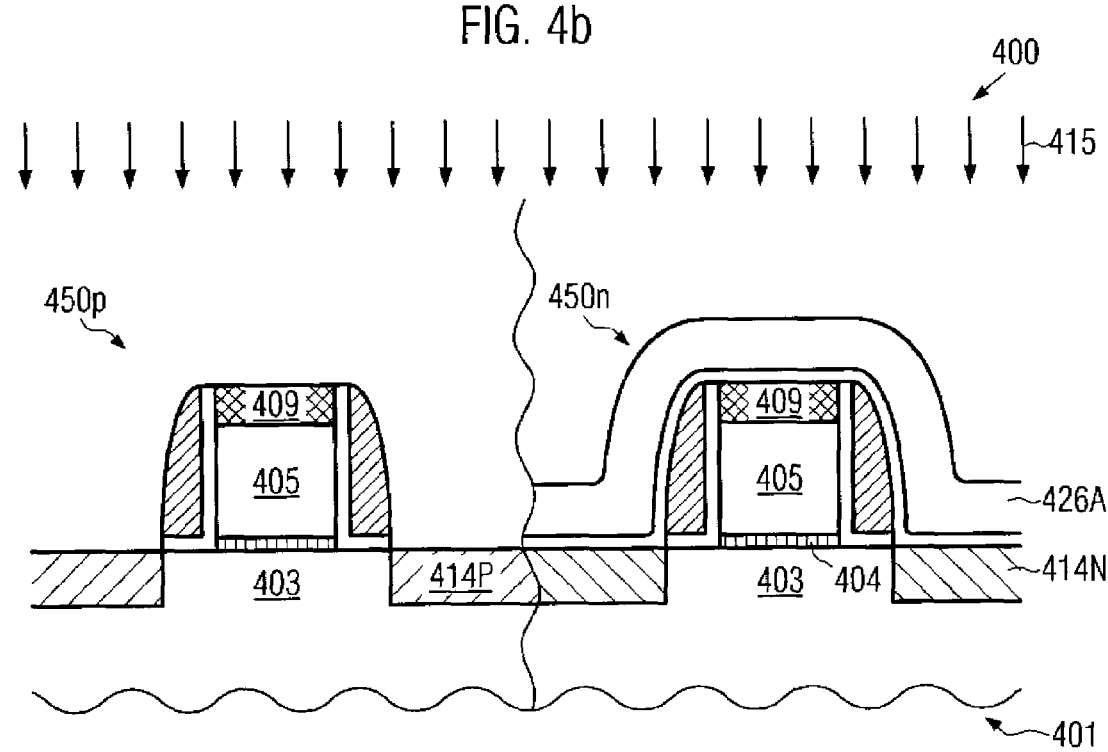

With reference to FIGS. 4a-4c, further illustrative embodiments will now be described in which a reduced process complexity is achieved by commonly forming a first strained material in two different transistors and subsequently selectively removing an unwanted portion thereof during the patterning of a respective growth mask.

FIG. 4a schematically illustrates a semiconductor device 400 including a first transistor 450p and a second transistor 450n in an advanced manufacturing stage. Each of the transistors 450p, 450n may comprise a gate electrode 405 formed on a respective gate insulation layer 404 that separates the gate electrodes 405 from respective channel regions 403. Moreover, the gate electrodes 405 are encapsulated by respective spacers 406 and capping layers 409, wherein a spacer layer 426A, possibly in combination with a liner 427A, is also formed to cover both transistors 450p, 450n. The transistors 450p, 450n may be formed in and on a respective semiconductor layer 402 located above a substrate 401. With respect to the various components described so far, the same criteria apply as explained before with respect to the same components of the devices 100, 200 and 300. Moreover, in this manufacturing stage, the device 400 comprises a first strained semiconductor material 414N formed in respective recesses positioned next to the corresponding channel regions 403. With respect to the characteristics of the material 414N, the same criteria apply as previously explained. Furthermore, a mask 412 may be provided to cover the second transistor 450n while exposing the first transistor 450p. The mask 412 may represent a resist mask or any other appropriate material.

The device 400 may be formed by the following manufacturing processes. After the formation of the respective gate electrodes 405 including the spacers 406, based on processes as are previously described, respective recesses may be formed by an appropriate etch process, as is also described with reference to FIG. 1d when describing the formation of the recesses 111. Thereafter, a selective epitaxial growth process may be performed to form the material 414N in the correspondingly etched recesses, wherein, during the etch process for forming the recesses and the subsequent epitaxial growth process, a high degree of process uniformity is achieved, since any micro and/or macro loading effects during the etch process and the epitaxial growth process may be significantly reduced as these processes may be performed without masks that may cover extended substrate areas when protecting respective transistors. Consequently, high controllability of the etch process and the subsequent epitaxial growth process may be achieved. Thereafter, the spacer layer 426A, possibly in combination with the liner 427A, may be deposited on the basis of well-established recipes followed by the formation of the mask 412 on the basis of lithography techniques. Thereafter, the layer 426A may be patterned on the basis of the mask 412, wherein, in some illustrative embodiments, a corresponding etch process may be continued so as to also remove the material 414N in the first transistor 450p. In other illustrative embodiments, the layers 426A and 427A may be patterned on the basis of the mask 412, which may then be removed by any appropriate techniques, such as oxygen plasma-based removal processes.

FIG. 4b schematically illustrates the device 400 after the completion of the above-described process sequence, when the layer 426A is patterned on the basis of the mask 412, which may then be removed, while, in a further etch process 410, the material 414N in the first transistor 450p is removed, while the remaining layer 426A reliably covers the second transistor 450n. During the etch process 410, the material 414N may be efficiently removed to provide the recess 411, while, in other embodiments, the etch process 410 may also be controlled with respect to shape and depth requirements of the recess 411. That is, the etch process 410 may be performed so that an increased size, for instance an increased depth, of the recess 411 may be obtained, or, in other embodiments, an isotropic component may be used during the etch process 410 so as to also significantly modify the shape of the recess 411. For convenience, any such change of shape, for instance by under-etching, is not shown.

FIG. 4c schematically illustrates the device 400 during a further selective epitaxial growth process 415 for forming a strained semiconductor material 414P according to device requirements for the first transistor 450p. During the process 415, the remaining layer 426A acts as a growth mask, as is previously described. Hence, a high degree of process flexibility is obtained, for instance with respect to different sizes and shapes of the strained semiconductor material portions 414P, 414N, while nevertheless a reduced process complexity is provided due to the usage of a single growth mask, i.e., the patterned layer 426A. This may be accomplished by performing a common epitaxial growth process and subsequently removing an unwanted portion of the selectively grown material.

With reference to FIGS. 5a-5e, further illustrative embodiments will now be described in which differently strained semiconductor materials may be formed in a highly efficient manner.

Figure 5A:
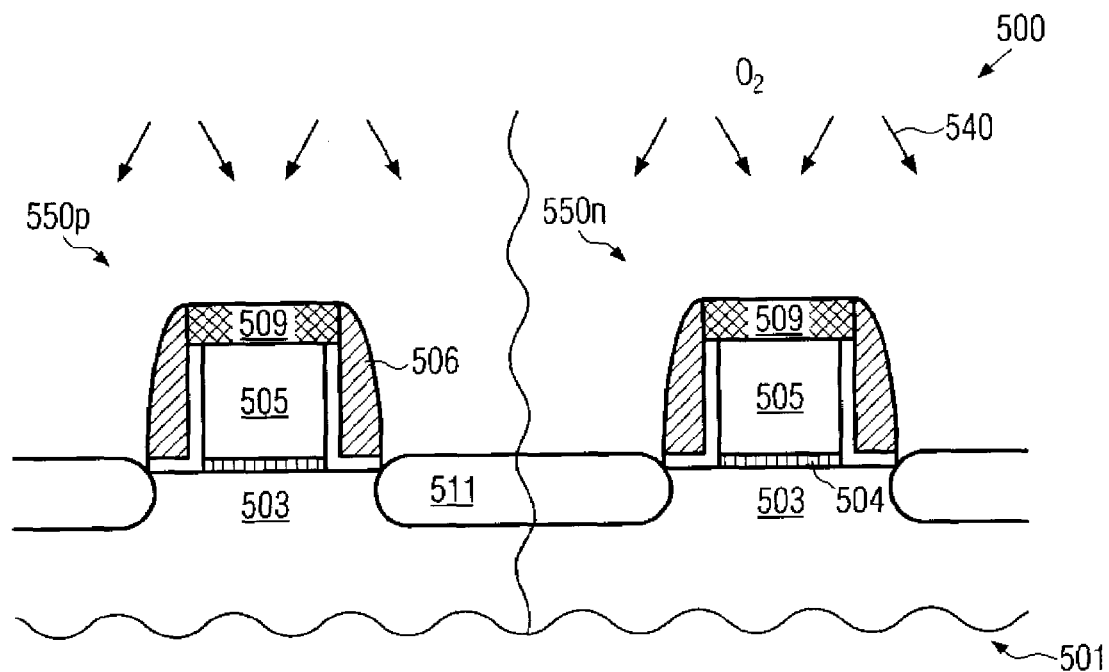
FIGS. 5a-5e schematically depict cross-sectional views of a semiconductor device during various manufacturing stages for forming differently strained semiconductor materials in different transistors on the basis of epitaxial growth masks from which at most one is patterned by lithography according to yet other illustrative embodiments of the present invention.

In FIG. 5a, a semiconductor device 500 may comprise first and second transistors 550p, 550n each comprising a gate electrode 505, a gate insulation layer 504, a capping layer 509 and sidewall spacers 506. Regarding these components, the same criteria apply as previously explained with reference to the devices 100, 200, 300, 400. Moreover, the device 500 may be subjected to a process 540 for defining growth areas adjacent to the respective gate electrodes 505 which are to receive respective strained semiconductor materials in a later stage. In one illustrative embodiment, the process 540 may represent an oxidation process during which exposed semiconductor portions may be oxidized, while an oxidation of the gate electrodes 505 is substantially suppressed by the spacers 506 and the capping layer 509, which may be comprised of silicon nitride. Consequently, a respective oxidized portion 511 may be formed, wherein the size and shape of the portion 511 may substantially define the size and shape of a strained semiconductor material to be formed in a later stage. In other illustrative embodiments, the portions 511 may represent recesses which may be formed by isotropic or anisotropic etch processes, as previously described, wherein additionally an oxidation process may be performed to form an oxidized surface portion in the respective recesses. A corresponding process strategy may be advantageous, when the substantially isotropic behavior of the oxidation process 540 may be considered inappropriate for the form of the finally obtained strained semiconductor material.

Figure 5B:
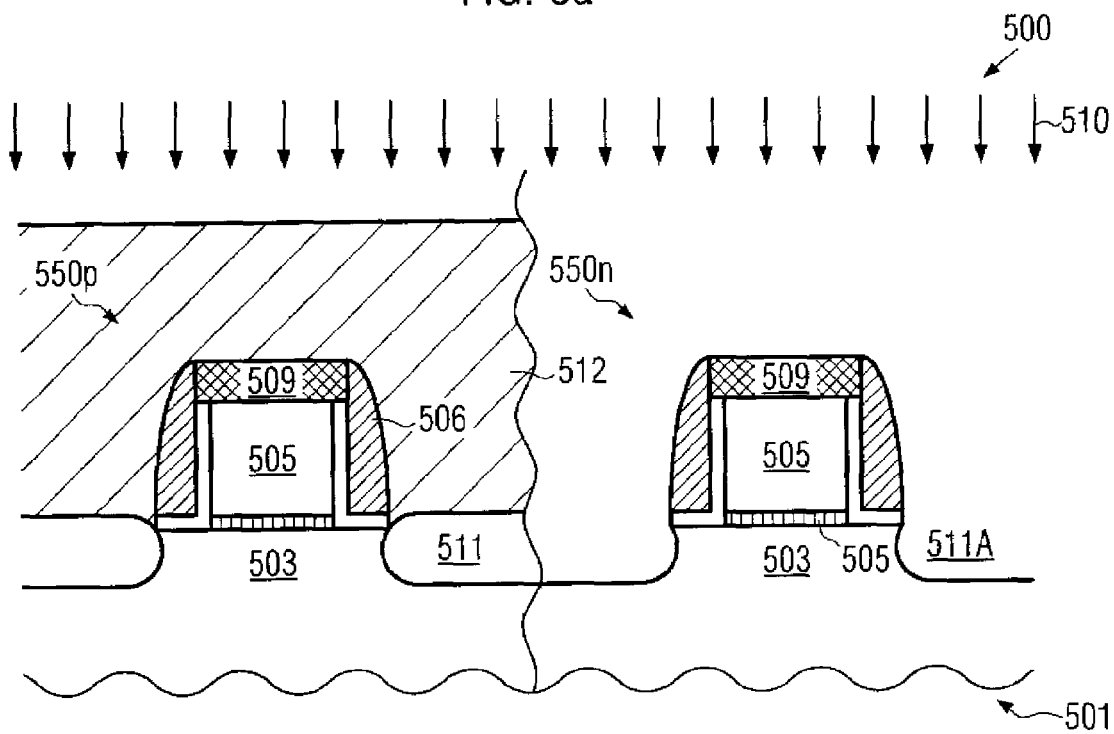

FIG. 5b schematically shows the device 500 during a further advanced manufacturing stage, in which a mask 512, such as a resist mask and the like, is formed in order to cover the first transistor 550p, while exposing the second transistor 550n to an etch ambient 510. For example, a wet chemical etch process or a plasma-based etch process or a combination thereof may be performed to selectively remove oxidized material in the portions 511 of the second transistor 550n. Consequently, the size and shape of the corresponding recesses 511A may be defined in some embodiments by a highly controllable oxidation process, such as the process 540, since the etch process 510 may have a high etch selectivity with respect to the semiconductor material of the layer 502, thereby substantially not removing any material thereof. In some illustrative embodiments, the etch process 510 may also include any cleaning processes for removing any contaminants in order to prepare the device 500 for a subsequent selective epitaxial growth process. To this end, the mask 512 may be removed and an appropriate etch step may be performed to remove the contaminants as required.

Figure 5C:
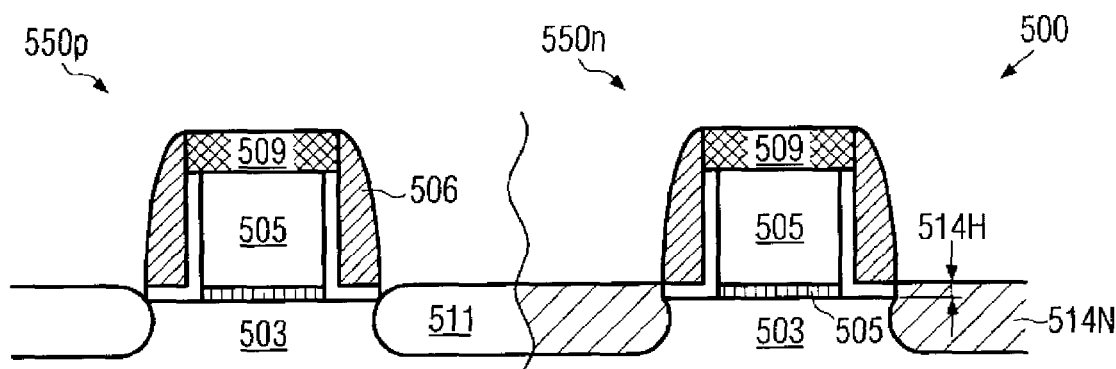

FIG. 5c schematically illustrates the device 500 after a selective epitaxial growth process, thereby forming a strained semiconductor material 514N while the material may not be substantially deposited on the first transistor 550p due to the encapsulation of the gate electrode 505 and the provision of the oxidized portion 511. With respect to the characteristics of the material 514N, the same criteria apply as previously explained. Moreover, in some illustrative embodiments, the material 514N may be provided with an extra height 514H so as to provide excess material that may be available for a surface modification as is also described with reference to the device 300.

Figure 5D:
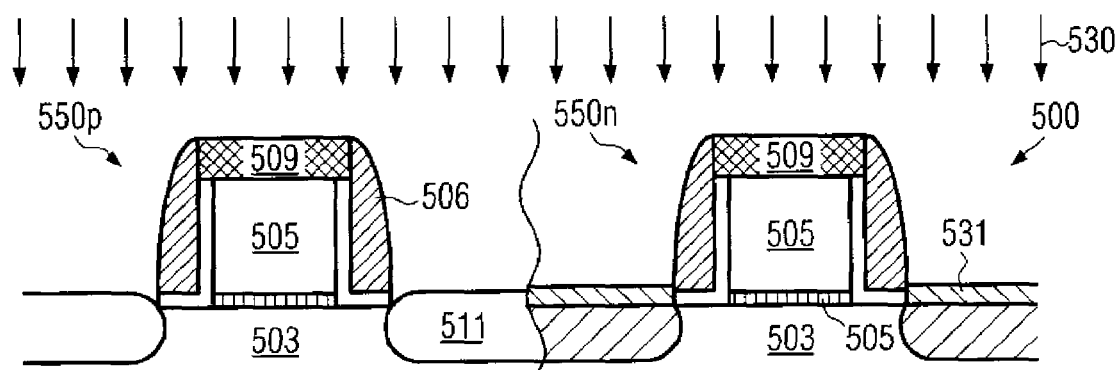

FIG. 5d schematically illustrates the device 500 during a corresponding surface modification process 530, which, in one illustrative embodiment, may be configured as a nitridation process for selectively converting a portion of the material 514N into a silicon nitride-like material. Consequently, the extra height provided in the previous selective epitaxial growth process may be efficiently used to form a nitrogen-enriched silicon material, which may have similar characteristics as a silicon nitride material. As previously explained, the extra height may be provided as a pure silicon material, as a silicon/carbon material and the like. Moreover, during the process 530, a corresponding less effective surface modification of the oxidized portion 511 of the first transistor 550p may nevertheless result in a high etch selectivity with respect to a corresponding material 531, as is previously explained. Consequently, the oxidized portion 511 may be efficiently removed, substantially without attacking the material 514N, which is covered by the layer portion 531.

Figure 5E:
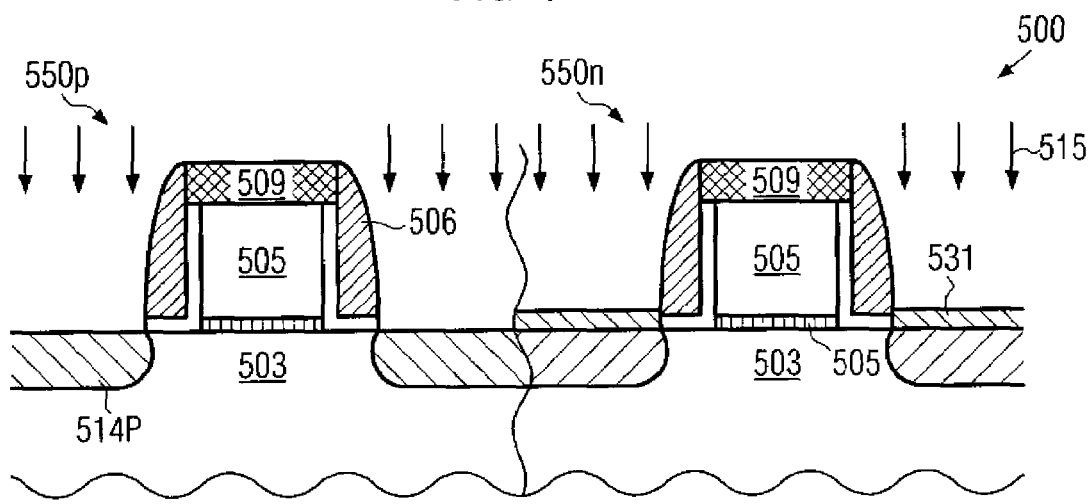

FIG. 5e schematically illustrates the device 500 after the completion of the above-described process sequence and exposed to a further epitaxial growth ambient 515 for the formation of a respective strained material 514P, which may have different characteristics compared to the material 514N, similarly as is also described previously. Moreover, during the selective epitaxial growth process 515, the layer portion 531 may act as a growth mask, thereby substantially suppressing any material deposition on the material 514N. Thereafter, the layer 531, as well as the spacers 506 and the capping layers 509, may be removed in a common etch process, for instance on the basis of highly selective wet chemical etch recipes. Thereafter, the further processing may be performed as is previously described. Hence, a highly efficient and well-controllable technique is provided, in which differently strained semiconductor materials may be formed in different transistors while nevertheless a significantly reduced process complexity is achieved.

As a result, the present invention provides an enhanced technique for the formation of different transistor types each having a different type of strain in the respective channel region, wherein embedded strained semiconductor layers are provided, which may be formed individually for each different transistor type. Hereby, a reduced process complexity may be achieved by significantly reducing the required process steps, especially for the formation of respective growth masks. In some illustrative embodiments, a reduction of process complexity may be achieved by reducing the number of required growth masks by exposing a previously grown strained semiconductor material to a further epitaxial growth ambient so as to form a respective capping layer for the previously formed material. In still other illustrative embodiments, one growth mask may be formed on the basis of a lithographical patterning process, while further growth masks may be formed on the basis of "self-aligned" techniques. In other illustrative embodiments, a high degree of flexibility in positioning respective strained semiconductor layers for different transistor types may be accomplished, while nevertheless a reduced degree of complexity is provided, in that a differential disposable spacer approach is used. Hence, even for highly advanced transistor elements, such as fully or partially depleted SOI devices, an efficient strain engineering for different transistor types may be obtained.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a first recess adjacent to a first gate electrode of a first transistor, said first gate electrode formed above a substrate comprising a crystalline semiconductor layer;

forming a second recess adjacent to a second gate electrode of a second transistor;

epitaxially growing a first strained semiconductor material in said first recess while preventing growth of said first strained semiconductor material in said second recess; and epitaxially growing a second strained semiconductor material in said second recess and above said first strained semiconductor material.

2. The method of claim 1, wherein forming said first and second recesses comprises commonly forming sidewall spacers on sidewalls of said first and second gate electrodes and forming said first and second recesses in a common etch process.

3. The method of claim 1, wherein epitaxially growing said first strained semiconductor material comprises covering at least said second recess and performing a first selective epitaxial growth process.

4. The method of claim 3, further comprising exposing said second recess and performing a second selective epitaxial growth process.

5. The method of claim 1, wherein said first strained semiconductor material has one of a compressive strain and a tensile strain and said second strained semiconductor material has the other one of said compressive strain and tensile strain.

6. The method of claim 5, wherein said first transistor represents a P-channel transistor and said first strained semiconductor material has a compressive strain.

7. The method of claim 1, further comprising forming a metal silicide compound in said second strained semiconductor material located above said first strained semiconductor material.

8. A method, comprising:
forming a first recess adjacent to a first gate electrode of a first transistor, said first gate electrode formed above a substrate comprising a crystalline semiconductor layer;
forming a second recess adjacent to a second gate electrode of a second transistor;
forming a first strained semiconductor material in said first recess using a first epitaxial growth process while covering said second recess with a growth mask that is formed without a lithographical patterning process; and
forming a second strained semiconductor material in said second recess using a second epitaxial growth process.

9. The method of claim 8, wherein forming said first and second strained semiconductor materials comprises forming a second growth mask above said first recess, selectively growing said second semiconductor material in said second recess, selectively forming said first growth mask on the basis of said second growth mask and exposing said first and second growth masks to an etch ambient for selectively removing said second growth mask.

10. The method of claim 8, wherein forming said first and second strained semiconductor materials comprises growing said second strained semiconductor material in said first and second recesses in a common epitaxial growth process, forming a mask layer above said first and second transistors, lithographically patterning said mask layer to form a second growth mask and removing said second strained semiconductor material from said first recess.

11. The method of claim 10, wherein lithographically patterning said mask layer comprises etching said mask layer and said second strained semiconductor material on the basis of a common resist mask.

12. The method of claim 8, wherein said one of said first and second strained semiconductor materials is formed above the other one of said first and second strained semiconductor materials.

13. The method of claim 8, wherein forming said second recess comprises oxidizing first and second substrate portions corresponding to said first and second recesses, respectively and selectively removing oxide from said second oxidized portion to form said second recess.

14. The method of claim 13, wherein said second strained semiconductor material is selectively grown using said first oxidized portion as a second growth mask.

15. The method of claim 14, further comprising forming said first growth mask on said second semiconductor material and forming said first recess and said first strained semiconductor material on the basis of said first growth mask.

16. The method of claim 15, wherein said first growth mask is formed by surface modification process.

17. A method, comprising:
forming a first recess adjacent to a first gate electrode of a first transistor, said first gate electrode having a first sidewall spacer and formed above a substrate comprising a crystalline semiconductor layer;
forming a first strained semiconductor material in said first recess while covering a second transistor;
forming a second recess adjacent to a second gate electrode of said second transistor, said second gate electrode having a second sidewall spacer;
forming a second strained semiconductor material in said second recess;
removing said first sidewall spacer; and
removing said second sidewall spacer.

18. The method of claim 17, wherein said first sidewall spacer is removed prior to forming said second recess.

19. The method of claim 18, wherein said first sidewall spacer is formed by forming a first mask layer above the first and second transistors and patterning said first mask layer to form said first sidewall spacer while maintaining said second transistor covered by said first mask layer.

20. The method of claim 18, wherein said second sidewall spacer is formed by forming a second mask layer above the first and second transistors and patterning said second mask layer to form said second sidewall spacer while maintaining said first transistor covered by said second mask layer.

21. The method of claim 17, wherein a width of said first sidewall spacer is adjusted independently from a width of said second sidewall spacer.

22. The method of claim 17, further comprising providing a buried insulating layer below said semiconductor layer.

23. The method of claim 17, wherein one of said first and second strained semiconductor materials comprises a compressive strain and the other one of said first and second strained semiconductor materials comprises a tensile strain.

* * * * *